METHOD OF MANUFACTURING A SEMICONDUCTOR DEVICE AND SEMICONDUCTOR DEVICE MANUFACTURED BY USING SUCH A METHOD

Filed March 1, 1972

Jan. 1, 1974 M. M. M. PAFFEN ET AL 3,783,047

METHOD OF MANUFACTURING A SEMICONDUCTOR DEVICE AND SEMICONDUCTOR DEVICE MANUFACTURED BY USING SUCH A METHOD

Filed March 1, 1972 18 Sheets-Sheet 12

United States Patent Office 3,783,047

Patented Jan. 1, 1974

3,783,047

METHOD OF MANUFACTURING A SEMICONDUCTOR DEVICE AND SEMICONDUCTOR DEVICE MANUFACTURED BY USING SUCH A METHOD

Maria Magdalena Mathilda Paffen, Johannes Arnoldus Appels, Wilhelmus Henricus Cornelis Gerardus Verkuijlen, and Else Kooi, Emmasingel, Eindhoven, Netherlands, assignors to U.S. Philips Corporation, New York, N.Y.

Filed Mar. 1, 1972, Ser. No. 230,614

Claims priority, application Netherlands, Mar. 17, 1971, 7103548

Int. Cl. H01l 7/34

U.S. Cl. 148—187 24 Claims

ABSTRACT OF THE DISCLOSURE

A method of manufacturing a semiconductor device. By using a double layer as a masking layer, the electric properties of two regions which are situated in the semiconductor body accurately relative to each other can be varied without an interim precision photomasking step.

Figure 1:
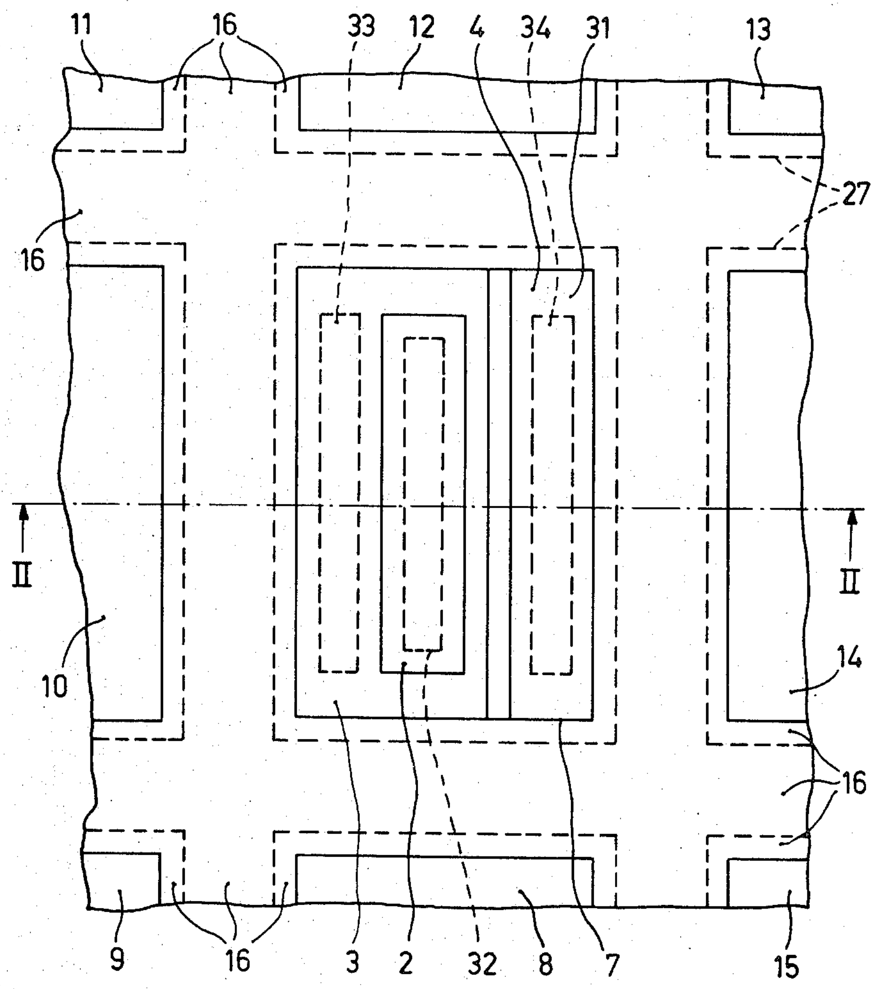

The invention provides very wide possibilities of application. For example, the first region can be doped with an impurity via an aperture in the masking layer, after which the lower component layer of the masking layer is underetched and an impurity is then introduced into the second region. It is also possible, after underetching the lower component layer, to oxidise the second region of the semiconductor body, as a result of which many important structures are obtained in a simple manner.

The invention relates to a method of manufacturing a semiconductor device having a semiconductor body, in which, via a surface part of the semiconductor body defined by a mask, hereinafter termed the small surface part, the electrical properties of a zone of the semiconductor body adjoining said small surface part, hereinafter termed small zone, are varied and, via a surface part of the semiconductor body likewise defined by a mask, hereinafter termed the large surface part, which is larger than the small surface part and comprises same, the electrical properties of a zone of the semiconductor body adjoining said large surface part, hereinafter termed the large zone, are varied.

The invention moreover relates to a semiconductor device manufactured by using such a method.

Electrical properties of a semiconductor zone are to be understood to mean herein quantities such as the resistivity, the conductivity type, the lifetime of the charge-carriers and properties which are consistent with said quantities, for example, the impurity concentration. The variation of said properties should be considered wide so as to include, for example, the conversion of the semiconductor material of a zone into an insulating material. The resistivity and/or the conductivity type can be varied, for example, by diffusion of an impurity, and, for example, a silicon zone may be converted into an insulating zone of silicon oxide by local oxidation.

A known method of the above-mentioned type is used, for example, in providing the base and emitter zone of a planar transistor. In this method a mask is provided on the surface of a semiconductor body, which mask consists of a layer which is provided with a window and masks against the diffusion of an impurity, said mask defining a large surface part of the semiconductor body by means of the window, an impurity being then diffused, via the window and the large surface part, in a large zone adjoining said surface part to form the base zone. The window is then closed and a small window is provided in the masking layer within the original window. A mask is then obtained which, by means of the small window, defines a small surface part, and an impurity is diffused through the new window in the small zone adjoining the small surface part so as to obtain the emitter zone.

The windows are provided in the masking layer in a conventional manner by means of a photomasking layer, a photomask and an etchant.

Because two separate photomasks are required to provide the two apertures, the photomask which is used in behalf of the aperture to be provided last, should be accurately aligned relative to the surface part of the semiconductor body already defined by the first window.

Such accurate alignment steps are difficult and cumbrous in particular according as the dimensions of the structures to be manufactured are smaller and/or the requirements imposed upon the accuracy of the dimensions are higher.

Moreover, the conventional alignment apparatus has only a restricted accuracy as a result of which, for example, structures of which one or more dimensions corresponds approximately with or are smaller than the tolerance imposed by the alignment apparatus, can substantially not be manufactured.

Furthermore, such known methods always require two separate photomasks as a result of which the possibility of errors occurring in the semiconductor device to be manufactured as a result of an inaccuracy or a damage in one of the masks is rather large.

Also, for example, upon providing an insulating layer inset in a semiconductor body by local oxidation with an underlying diffused zone, difficulties similar to those described above in relation to the provision of a diffused base and emitter zone occur.

One of the objects of the present invention is to provide a simple and practical method by the use of which the said difficulties are avoided at least for the greater part.

Therefore, a method of the type mentioned in the preamble is characterized according to the invention in that a masking layer is provided on a surface of the semiconductor body which layer comprises at least two component layers of different materials, namely, viewed on the masking layer, an uppermost component layer, termed top layer, and an adjoining component layer, termed intermediate layer, and, for carrying out the treatment to vary the electrical properties of the small zone, at least the top layer of the masking layer is provided with an aperture, termed small aperture, which defines the small surface part of the semiconductor body, and, for carrying out the treatment to vary the electrical properties of the large zone, the intermediate layer is provided with an aperture, termed large aperture which defines the large surface part of the semiconductor body, by selectively etching the intermediate layer, the top layer masking against said etching treatment and the intermediate layer being removed from the aperture in the top layer to below the top layer over a distance which is larger than the thickness of the intermediate layer.

By using a masking layer which comprises at least two component layers which can be etched selectively relative to each other and by providing the large aperture in the intermediate layer by under-etching the intermediate layer via the small aperture in the top layer, in which the top layer serves as a masking layer, it is achieved that, without an accurate interim and time-consuming alignment step and while using only one photomask, an accurate structure can be obtained.

In a practical embodiment of a method according to the invention a small aperture is provided also in the intermediate layer after providing the small aperture in the top layer by subjecting the intermediate layer via the small aperture in the top layer to a selective etching treatment, the electrical properties of the small zone being then varied via the small aperture in the masking layer and the small surface part, for example, by diffusing an impurity, the intermediate layer being then provided with the large aperture. It is to be noted that it is not always necessary to provide the small aperture also in the intermediate layer, for example, in the case in which the intermediate layer consists of silicon oxide and the impurity is gallium.

After providing the large aperture in the intermediate layer the top layer can be removed in many cases if desirable, prior to performing the treatment to vary the electrical properties of the large zone.

In those cases, however, in which it is desirable or necessary that the top layer is not removed, for example, in behalf of the treatment to vary the electrical properties of the large zone, it may yet be advantageous to remove the parts of the top layer which project above the large aperture in the intermediate layer, for example, by breaking the said parts by ultrasonic vibrations. This is preferably carried out during the selective etching of the intermediate layer.

Another preferred embodiment of a method according to the invention is characterized in that the treatment to vary the electrical properties of the small zone is carried out prior to the provision in the intermediate layer of the large aperture and that, after providing the large aperture in the intermediate layer, the top layer is subjected to a selective etching treatment in which the top layer is removed over at least half of its thickness and the parts of the top layer which project above the large aperture in the intermediate layer are also subjected to the etching treatment via the large aperture in the intermediate layer and are entirely removed.

In many applications of a method according to the invention, an embodiment of the method according to the invention may be used advantageously which is characterized in that during the selective etching of the intermediate layer to obtain the large aperture, a coherent part of the intermediate layer is divided into at least two separated parts by said selective etching treatment.

In accordance with the specific manner in which a method according to the invention is carried out, many important structures which are suitable for a variety of applications can be obtained. An important embodiment of a method according to the invention is characterized in that a masking layer is used which masks the underlying semiconductor material of the semiconductor body both against doping with an impurity and against oxidation, and the electrical properties of the small zone are varied by introducing an impurity via the small aperture into the small zone, and the electrical properties of the large zone are varied by oxidizing the large zone by means of an oxidation treatment via the large aperture, the impurity provided in the small zone diffusing further in the semiconductor body during the oxidation as a result of which locally a doped zone is obtained below the oxide layer which is obtained by the oxidation treatment, which oxide layer is inset in the semiconductor body at least over a part of its thickness.

In this method, for example, a semiconductor body of silicon or silicon carbide may be used, a zone of which is converted into silicon oxide by local oxidation, in which one of the component layers may consist, for example, of silicon nitride masking against oxidation and the other may consist of silicon oxide.

It is to be noted that materials other than silicon oxide may also be used for the component layers of the masking layer, for example, aluminium oxide, polycrystalline silicon, and silicon carbide.

By using such a method, a structure is obtained having an inset oxide layer and a doped zone present below the oxide layer which are situated accurately relative to each other in the semiconductor body. Such structures may be used advantageously in various manners as will be described in detail below.

Another important embodiment of a method according to the invention is characterized in that a masking layer is used which masks the underlying semiconductor material of the semiconductor body against doping with impurities, and the electrical properties of the small zone are varied by introducing an impurity into the small zone via the small aperture, and the electrical properties of the large zone are varied by introducing an impurity into the large zone via the large aperture. In this method two doped regions are obtained which are situated accurately relative to each other.

The impurity may be provided in the small zone, for example, by means of ion implantations. In this case it is possible to provide the large aperture in the intermediate layer already prior to the ion implantation, the portion of the large surface part which surrounds the small surface part being masked against ion implantation by the shadow effect of the parts of the top layer projecting above the large aperture. A preferred embodiment of a method according to the invention, however, is characterized in that the electrical properties of the small zone are varied by means of diffusion of an impurity via the small aperture prior to providing the intermediate layer with the large aperture.

In a practical embodiment, a small aperture is also provided in the intermediate layer via the small aperture in the top layer prior to providing the impurity in the small zone.

In the case a method according to the invention is used to obtain an inset oxide layer with an underlying doped zone, the impurity atoms provided in the small zone diffuse further in the semiconductor body ahead of the growing oxide. This diffusion occurs not only in a direction perpendicular to the surface of the semiconductor body to be masked, but also in directions parallel to said surface as a result of which, in case the intermediate layer is not removed or is removed only over a small distance from the small aperture, a structure can be obtained in which the doped zone surrounds the inset oxide in the semiconductor body and adjoins the surface of the semiconductor body besides the inset oxide.

A preferred embodiment of a method according to the invention is characterized in that an inset oxide layer which, viewed in a direction perpendicular to the surface of the semiconductor body, projects beyond the doped zone at least along a part of the circumference of said zone, is provided by the oxidation treatment.

In this case the doped zone can extend only below the inset oxide layer which is desirable for a number of applications. It is also possible that the doped zone merges at the surface of the semiconductor body along the circumference of the inset oxide layer and, for example, can be contacted there.

Because during the oxidation the material of the large zone experiences an increase in volume, the resu'ting oxide layer will project partly above the surface of the semiconductor body. In those cases in which it is desirable, for the semiconductor device to have a substantially plane surface, for example, in behalf of metal tracks to be provided on the surface in a later stage of the process, a method may advantageously be used which is characterized in that after providing the large aperture an etching-treatment is carried out as a result of which a recess is formed at the surface of the semiconductor body at the region of the large aperture in the masking layer, said recess extending to a smaller distance from the surface than the small zone, the oxidation treatment being then carried out in which the recess is at least partly filled with oxide.

In order to obtain an oxide layer which is locally inset in the semiconductor body over a large part of its thickness while avoiding long oxidation times, an embodiment of a method according to the invention may advantageously be used which is characterized in that prior to providing the impurity in the small zone via the small aperture, the semiconductor body is subjected to a material-removing treatment via the small aperture as a result of which a recess is formed at the surface of the semiconductor body at the region of the said small aperture, said recess being at least partly filled with oxide during the oxidation treatment.

In accordance with the nature of the semiconductor device to be manufactured such a method may be used in a variety of manners. For example, in order to obtain an integrated semiconductor device having isolated islands, a semiconductor body may be used which comprises a surface layer of one conductivity type adjoining the surface of the semiconductor body to be masked and a part, termed substrate, of the opposite conductivity type adjoining said surface layer, the surface layer being divided into a number of islands by means of isolation zones, the doped zone adjoining the oxide layer which is inset in the semiconductor body over at least a part of its thickness being provided as a zone of the opposite conductivity type, at least a part of the inset layer and the part of the doped zone adjoining said part of the oxide layer being provided in the form of a pattern in which said parts surround the islands, and at least the said part of the oxide layer forms part of the isolation zones.

Such isolation zones present many advantages over the usual isolation zones which mostly consist of diffused zones of the opposite conductivity type. Circuit elements may be provided in the islands, of which elements one or several zones laterally adjoin the inset oxide, as a result of which a more compact structure and also a considerable reduction of stray capacitances can be obtained. In practical embodiments, the doped zone will usually extend up to the substrate. It is, however, also possible for the doped zones to extend only to near the substrate, in which the depletion layer of the p-n- junction between the substrate and the epitaxial layer occurring during operation of the semiconductor device to be manufactured extends in the epitaxial layer up to the doped zone and completes the isolation between the islands. Moreover, a highly doped zone of the opposite conductivity type may locally be provided in the substrate which zone partly diffuses in the epitaxial layer during the provision of the inset oxide layer and, in cooperation with the doped zone, forms part thereof the isolation zone.

In a method according to the invention in which a doped zone is obtained below an inset oxide layer, the doped zone adjoining the inset oxide layer may also advantageously be constructed as a channel-interrupting zone, for which purpose it is provided as a zone of the same conductivity type but having a higher doping than the part of the semiconductor body surrounding the zone.

As a result of this it may be prevented that inversion of the conductivity type occurs below the oxide, as a result of which zones of circuit elements provided on either side of the inet oxide layer might be undesirably interconnected.

This may be used in the above-mentioned island isolation in which the inset oxide layer is provided throughout the thickness of the epitaxial layer and the doped zone in the substrate, the doped zone being of the same conductivity type as but having a higher doping than the substrate. The isolation zones then consist of oxide and due to the doped zone it is prevented that inversion of the conductivity type occurs below the oxide layer as a result of which island-connecting channels could be formed in the substrate.

An important embodiment of a method according to the invention in which the doped zone is constructed as a channel-interrupting zone located below the inlet oxide layer and by means of which a number of important semiconductor structures can be manufactured is characterized in that a semiconductor body is used of which at least a part adjoining the surface to be masked is of one conductivity type, and the inset oxide layer with the adjoining doped zone are provided in said part, the oxide layer, viewed in a direction perpendicular to the surface of the semiconductor body, showing an aperture which is surrounded by the doped zone which shows a larger aperture the edge of which is situated entirely below the inset oxide layer, a surface zone of a semiconductor circuit element being formed in the said part of the semiconductor body at the region of the aperture in the oxide layer, which surface zone adjoins, at least along a part of its circumference, the oxide layer surrounding said aperture and which is separated from the doped zone.

Semiconductor zones provided in the aperture and adjoining the surface can be contacted by means of metal layers which extend to over the inset oxide layer, which oxide layer may be thick as a result of which a small capacity occurs between said metal layers and the semiconductor body which is of importance for many applications. Moreover, said semiconductor zones are surrounded by a channel-interrupting zone.

This latter embodiment may advantageously be used to manufacture an insulated gate field effect transistor in which two surface zones of the opposite conductivity type which are separated from each other are provided in the said part of the semiconductor body at the region of the aperture in the inset oxide layer, said surface zones adjoining, at least along a part of their circumference, the oxide layer surrounding the aperture, being separated from the doped zone and constituting the source and drain zones of the transistor with the intermediate channel region, a gate electrode being provided above the channel region and being insulated from it by an insulating layer the thickness of which is smaller than the thickness of the said oxide layer.

The last-mentioned embodiment can furthermore be used advantageously to manufacture a photosensitive target of the type used in camera tubes, in which an inset oxide layer is provided in the said part of the semiconductor body comprising a number of apertures in which, viewed in a direction perpendicular to the surface, each aperture is surrounded by the channel-interrupting doped zone and in which, via each of these apertures, a surface zone of the opposite conductivity type is provided in the semiconductor body which surface zone adjoins, along its circumference, the inset oxide and forms a p-n junction with the underlying semiconductor material, which junction extends substantially parallel to the surface in the semiconductor body and which is separated from the doped zone.

An important type of field effect transistors is an insulated gate field effect transistor in which the gate electrode, viewed in a direction from the source to the drain zone, extends to in the proximity of but not up to the drain zone. Such field effect transistors are referred to in literature as "offset gate" field effect transistor. During the manufacture of such field effect transistor a very accurate alignment step is necessary for providing the gate electrode so as to obtain the desirable distance between the gate electrode and the drain zone viewed in a direction from the source zone to the drain zone. By means of an embodiment of the method according to the invention in which a doped zone is obtained below an inset oxide layer, a field effect transistor having similar electrical properties as an "offset gate" field effect transistor can be obtained in which said accurate alignment step is avoided. This embodiment is characterized in that the small zone and the large zone are situated in a region of one conductivity type of the semiconductor body adjoining the surface to be masked and two zones of the opposite conductivity type are provided in said region and constitute the source and drain zones of the transistor with the intermediate channel region, the drain zone being constructed as the doped zone obtained below the inset oxide layer, the inset oxide layer overlapping a part of the channel region adjoining the drain zone, an insulating layer being provided on the surface of the channel region situated between the source zone and the inset oxide layer and being thinner than the inset oxide layer, the gate electrode of the transistor being provided on said thin layer.

The distance between the thin insulating layer and the drain zone is given by the distance between the edge of the inset oxide layer and the drain zone, which distance can be controlled accurately without an alignment step. The gate electrode is provided on the thin insulating layer in which no accurate alignment step is necessary since the gate electrode may overlap the thicker inset oxide layer because the capacity between the overlapping part of the gate electrode and the semiconductor body is small as a result of which said overlapping part of the gate electrode does substantially not influence the operation of the transistor.

A method according to the invention in which the electrical properties of both the small zone and the large zone are varied by doping with impurities may also be used in a variety of manners in accordance with the nature of the semiconductor device to be manufactured. Such a method according to the invention may be used, for example, to manufacture a p-n junction having an increased breakdown voltage. It is to be noted that a p-n junction manufactured by a conventional method by means of diffusion of an impurity shows the drawback, in particular in the case in which the junction is used as a Zener diode, that the breakdown voltage of the p-n junction near the surface of the semiconductor body is lower than deeper in the semiconductor body. As a result of this the current-voltage characteristic of the junction shows a low stability. This drawback is avoided at least for the greater part when an embodiment of a method according to the invention is used for manufacturing a p-n junction having an increased breakdown voltage which is characterized in that the small zone and the large zone are present in a region of one conductivity type of the semiconductor body adjoining the surface to be masked, the small zone extending from the surface deeper in said region than the large zone, the conductivity type of the zones being converted, by doping with impurities, from one conductivity type into the other, a higher surface concentration of the said impurities being provided in the small zone than in the parts of the large zone surrounding the small zone.

Since the surface concentration in the large zone near the edge of the resulting p-n junction adjoining the surface is low, the breakdown voltage of the p-n junction near the surface is high and the breakdown will occur deeper in the semiconductor body which benefits the stability.

A further important embodiment of a method according to the invention to manufacture a transistor and in which both the small and the large zone are doped is characterized in that the small zone and the large zone are present in a region of one conductivity type of the semiconductor body adjoining the surface to be masked, the large zone extending from the surface to be masked deeper in said region than the small zone, the concentration of impurities which cause the one conductivity type being increased in the small zone, impurities which cause the opposite conductivity type being provided in the large zone in a concentration which lies between that of the impurities in the said region of one conductivity type and that of the small zone of the one conductivity type, so that the part of the large zone surrounding the small zone obtains the opposite conductivity type, as a result of which a transistor structure is obtained the small zone of which constitutes the emitter zone, the part of the large zone surrounding the small zone is associated with the base zone, and the part of the said region of the semiconductor body surrounding the large zone constituted the collector zone.

By using this embodiment of a method according to the invention, an accurate transistor structure can be obtained in which the base and emitter zones are obtained by means of only one photomask. In the case in which the dimensions are so small that it is difficult to provide a base contact electrode on the base zone, and embodiment of a method according to the invention may advantageously be used which is characterized in that, simultaneously with the provision of the small aperture in the top layer, a further aperture situated near said small aperture is provided in the top layer, the surface part of the semiconductor body present below the further aperture being masked against doping by the intermediate layer during the doping of the small zone via the small surface part, the intermediate layer being subjected, also via the further aperture in the top layer, to the selective etching treatment during provision the large aperture in the intermediate layer, as a result of which a part of the intermediate layer which defines a further surface part of the semiconductor body and is present below the further aperture is removed, the electrical properties of the large zone and of a zone adjoining the further surface part and adjoining the large zone being then varied by doping with impurities. In this case also no accurate interim alignment step is necessary. The etching treatment may be carried out for such a period of time that the part of the intermediate layer present between the large aperture and the further aperture in the top layer is entirely removed.

Figure 2A:
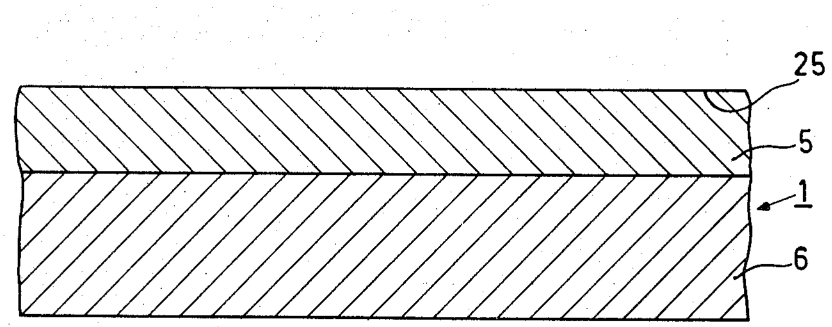
Figure 2B:
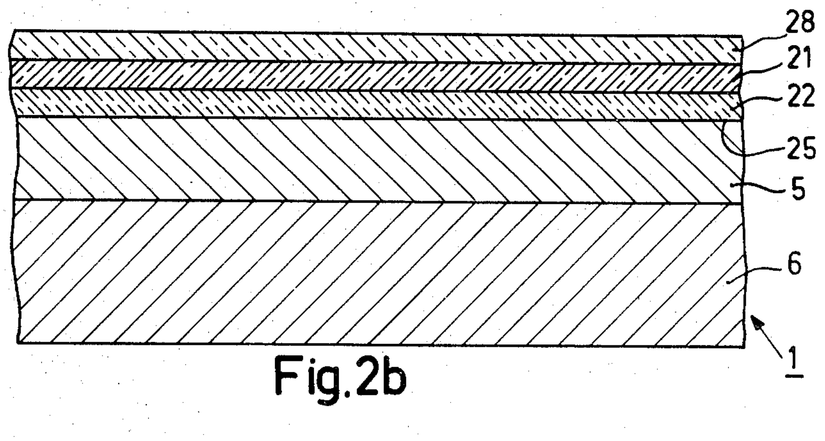
Figure 2C:
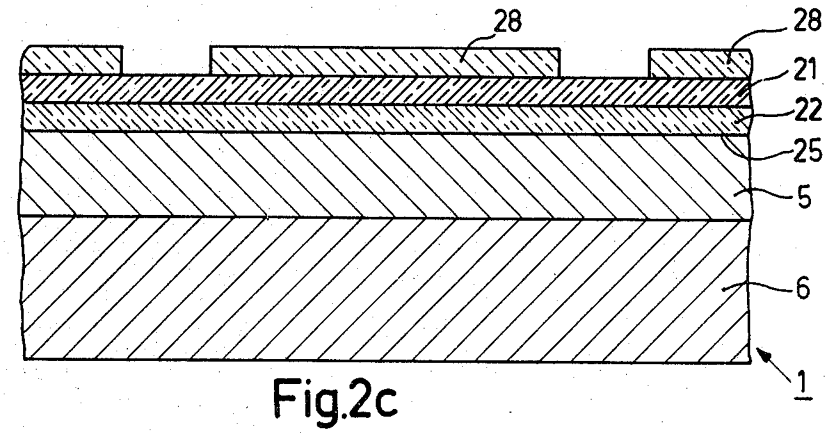
Figure 2D:
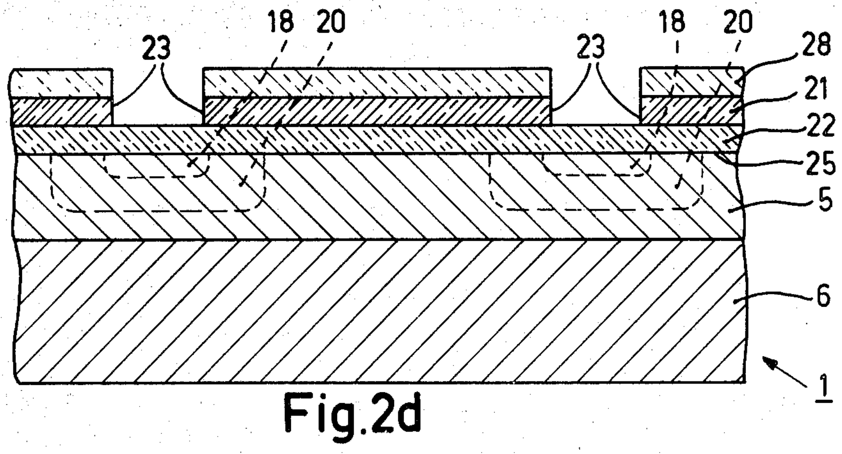
Figure 2E:
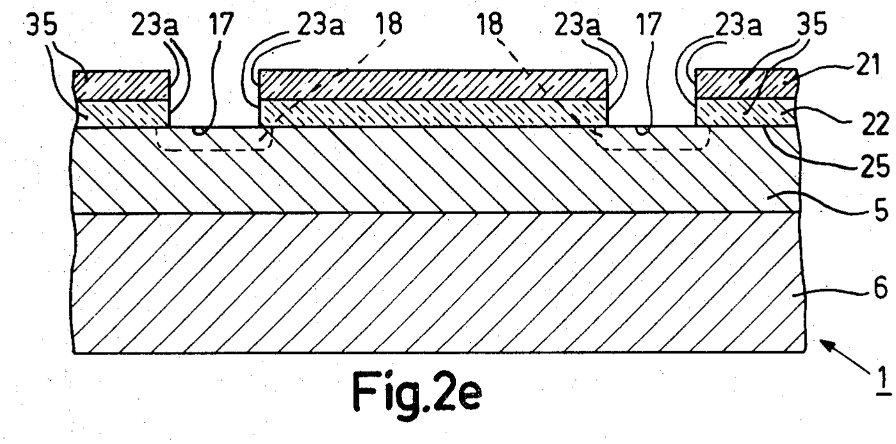
Figure 2F:
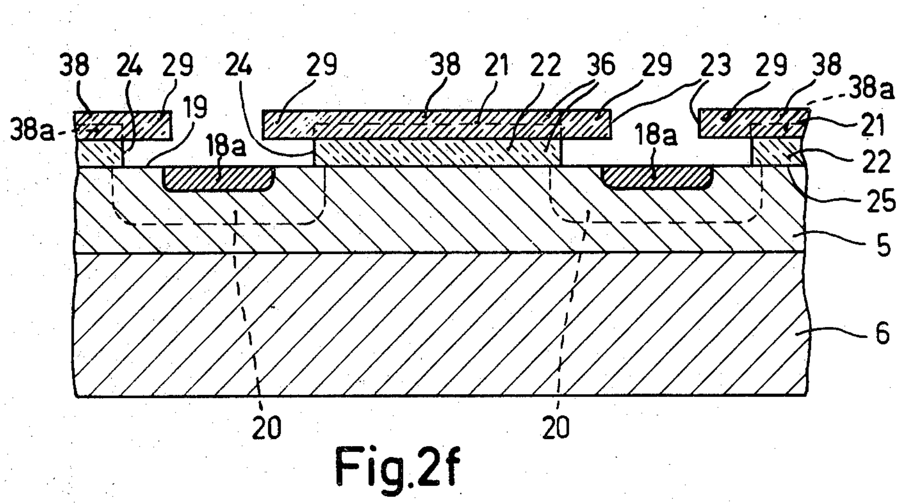
Figure 2G:
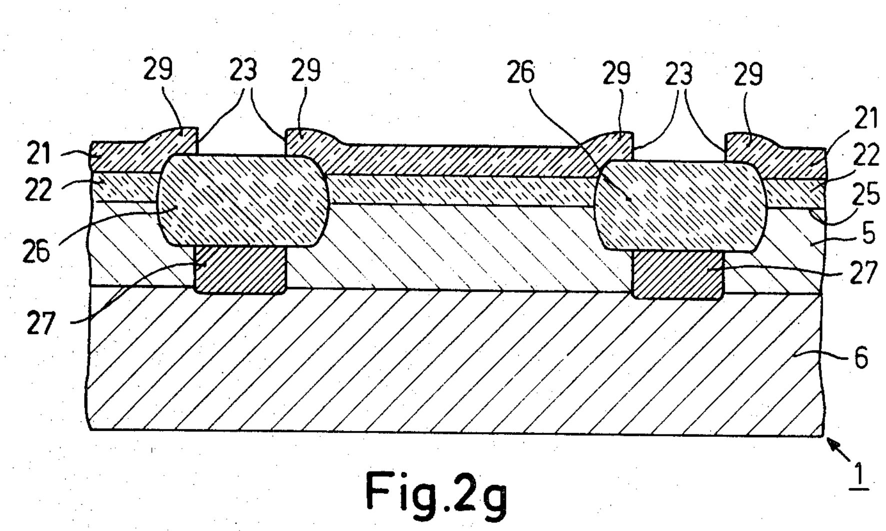
Figure 2H:
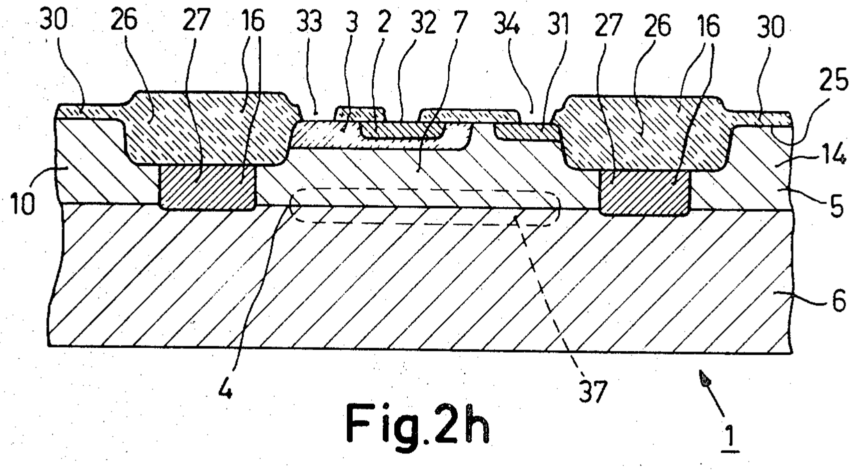

In order that the invention may be readily carried into effect, a few embodiments thereof will now be described in greater detail, by way of example, with reference to the accompanying drawings in which:

FIG. 1 is a plan view of a part of a semiconductor device manufactured by means of a method according to the invention and of which FIG. 2*h* is cross-sectional view taken on the line II—II in FIG. 1.

FIGS. 2*a* to 2*g* are cross-sectional views corresponding to that shown in FIG. 2*h* in a number of stages during the manufacture of the semiconductor device shown in FIGS. 1 and 2*h*.

Figure 3A:
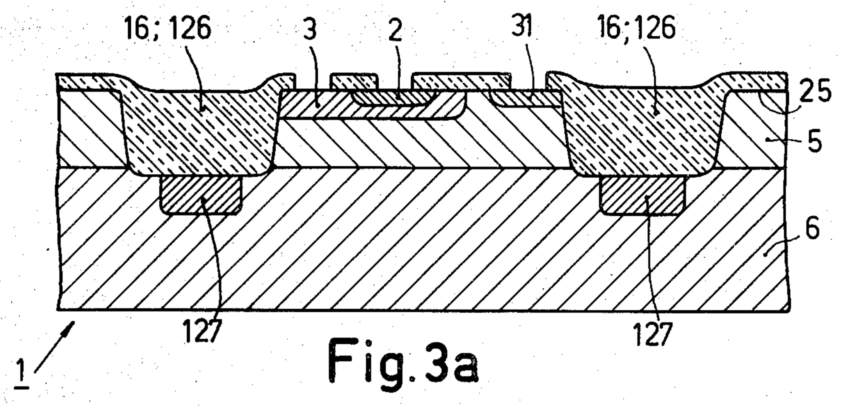
Figure 3B:
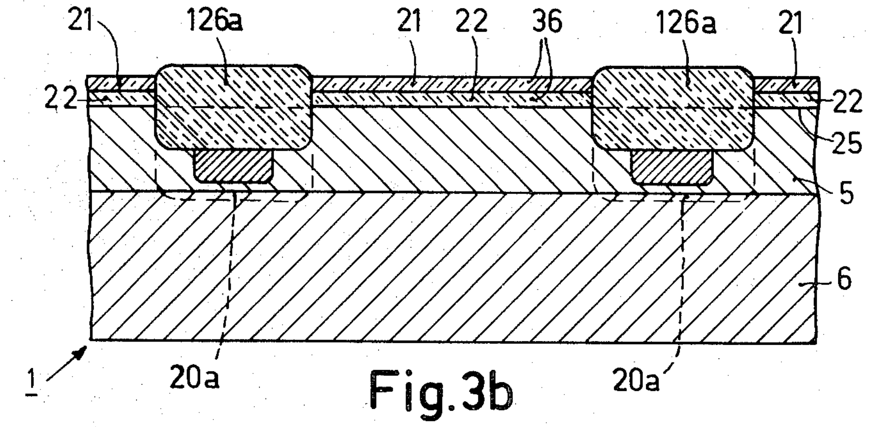

FIG. 3*a* is a cross-sectional view of a slightly different semiconductor device the plan view of which is the same as that of the semiconductor device shown in FIGS. 1 and 2*h*, and FIGS. 3*b* and 3*c* of which are cross-sectional views in two stages during the manufacture of said semiconductor device by means of a method according to the invention.

Figure 4A:
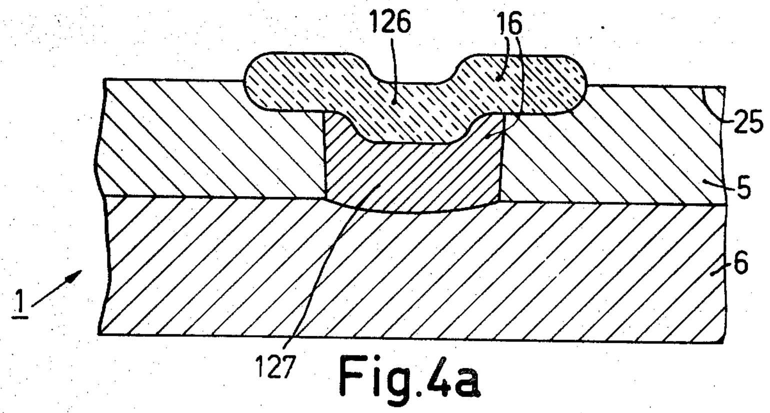

FIG. 4*a* is a cross-sectional view of an isolation zone which may be used in a semiconductor device shown in the preceding figures.

Figure 4B:
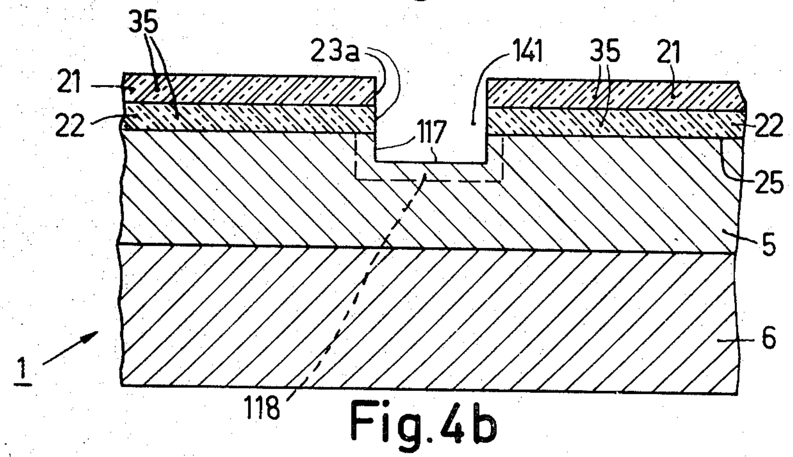
Figure 4C:
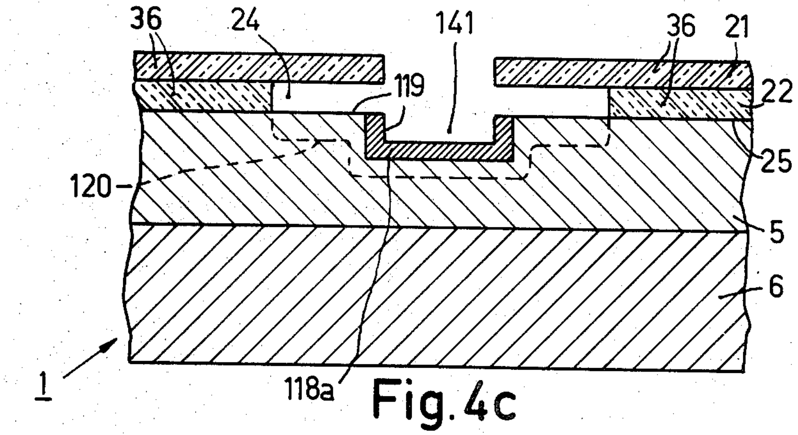

FIGS. 4*b* and 4*c* are cross-sectional views corresponding to that shown in FIG. 4*a* in two stages of the manufacture by means of a method according to the invention.

Figure 5A:
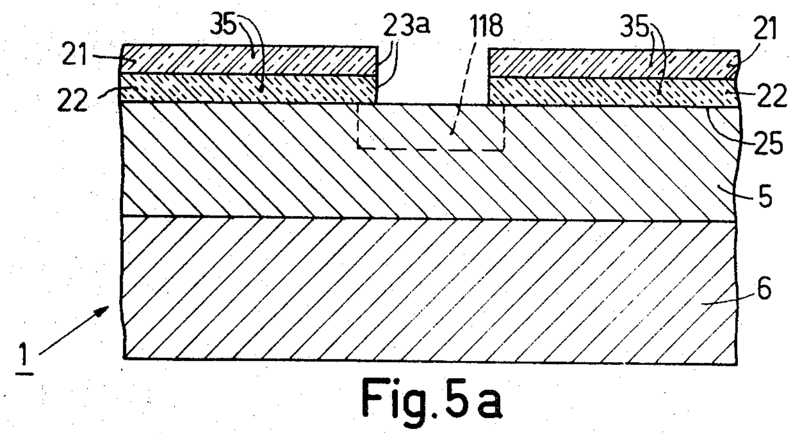
Figure 5B:
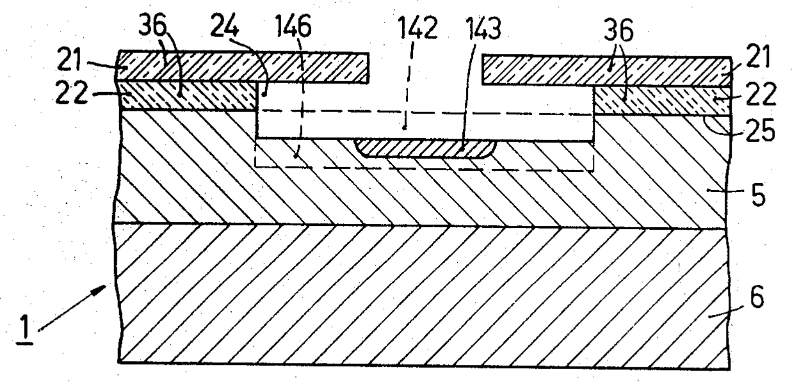
Figure 5C:
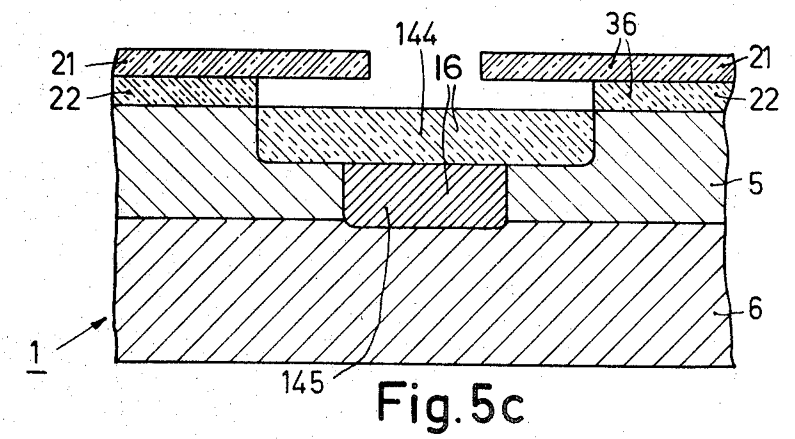

FIG. 5*c* is a cross-sectional view of another embodiment of an isolation zone which may be used in a semiconductor device shown in FIGS. 1 to 3*c*.

FIGS. 5*a* and 5*b* are two cross-sectional views corresponding to that of FIG. 5*c* in two stages of manufacture by means of a method according to the invention.

Figure 6:
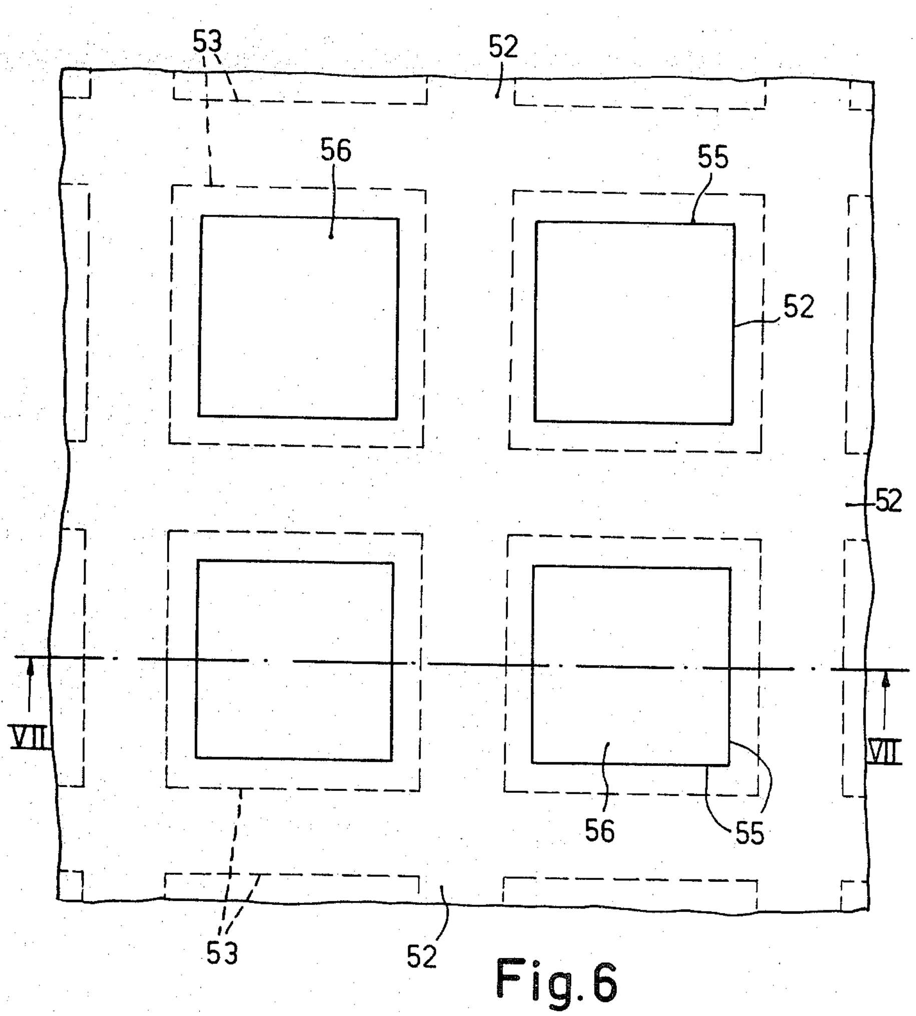
Figure 7:
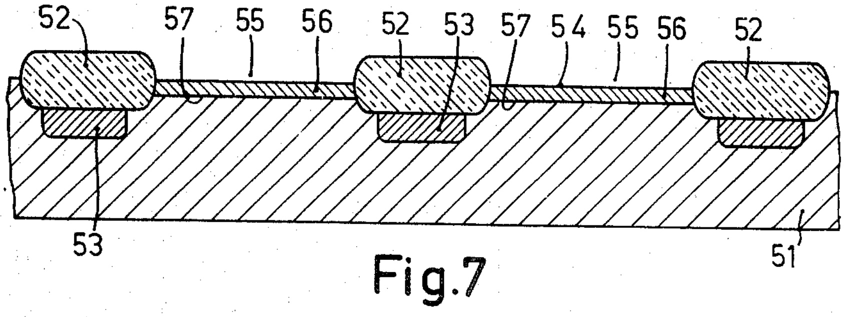

FIG. 6 is a plan view of a part of a photosensitive target manufactured by using a method according to the invention and of which FIG. 7 is a cross-sectional view taken on the line VII—VII of FIG. 6.

Figure 8A:
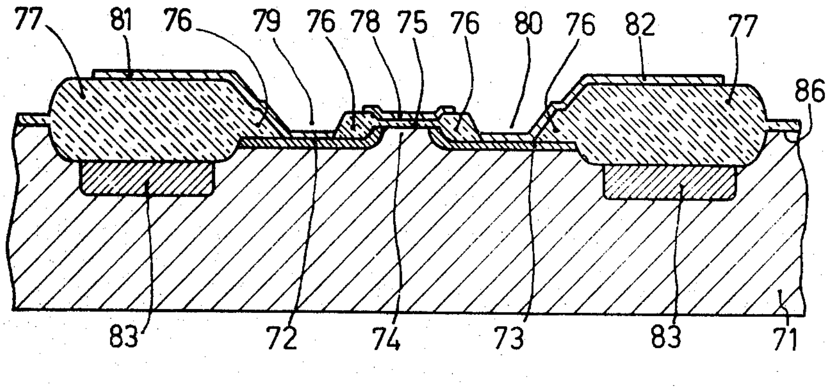

FIG. 8*a* is a cross-sectional view of an insulated gate field effect transistor manufactured by means of a method according to the invention.

Figure 8B:
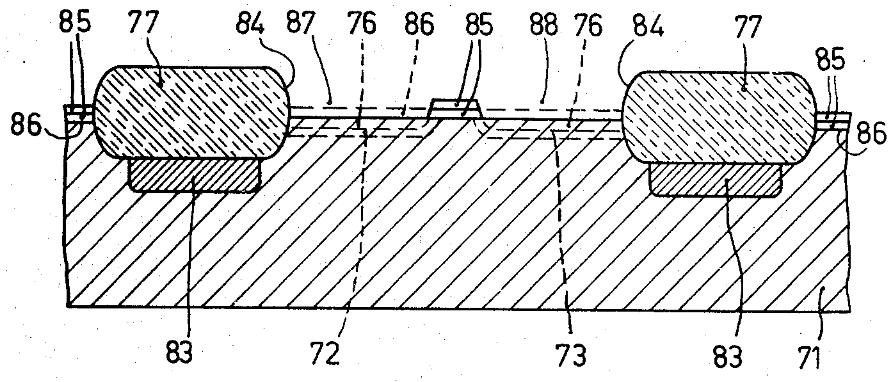

FIG. 8*b* is a cross-sectional view corresponding to that shown in FIG. 8*a* during the manufacture of the semiconductor device.

Figure 9A:
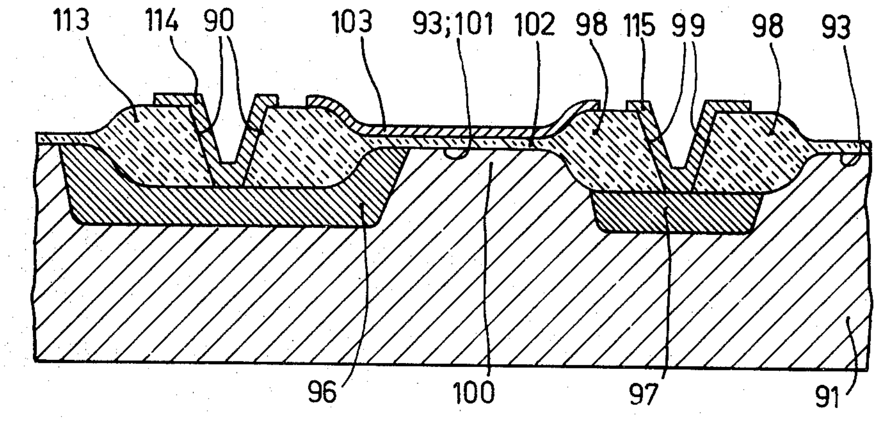

FIG. 9*a* is a cross-sectional view of another insulated gate field effect transistor manufactured by using a method according to the invention.

Figure 9B:
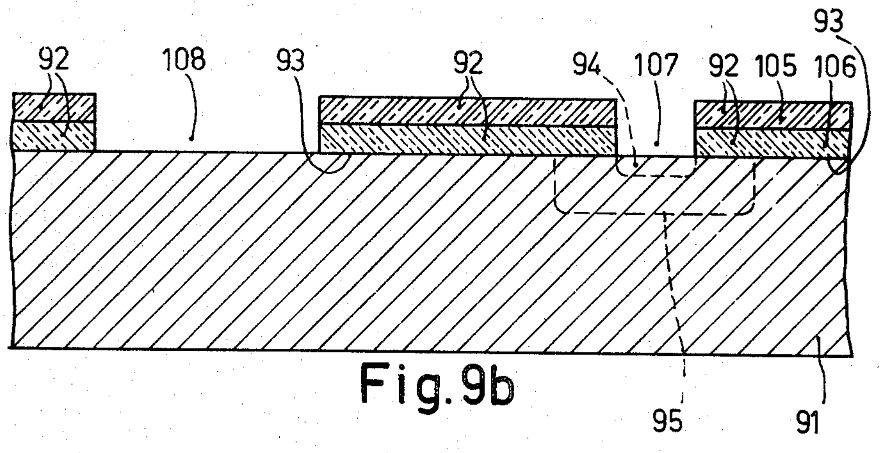
Figure 9C:
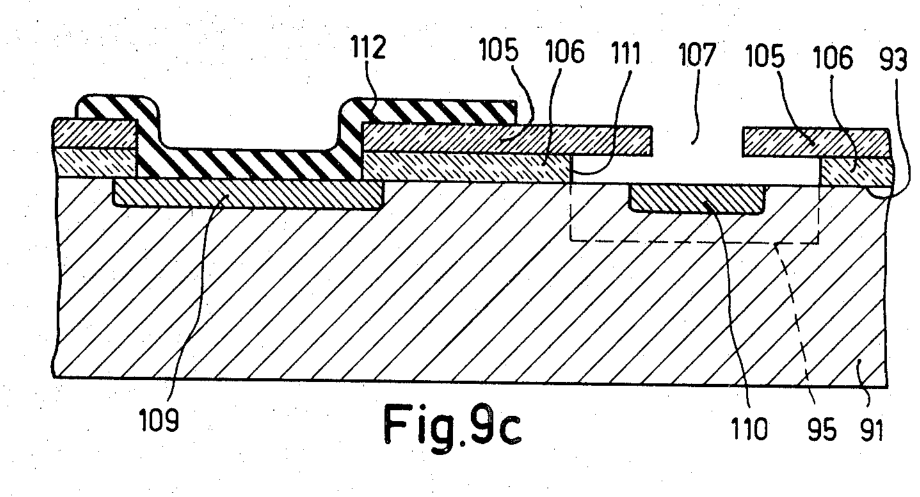
Figure 9D:
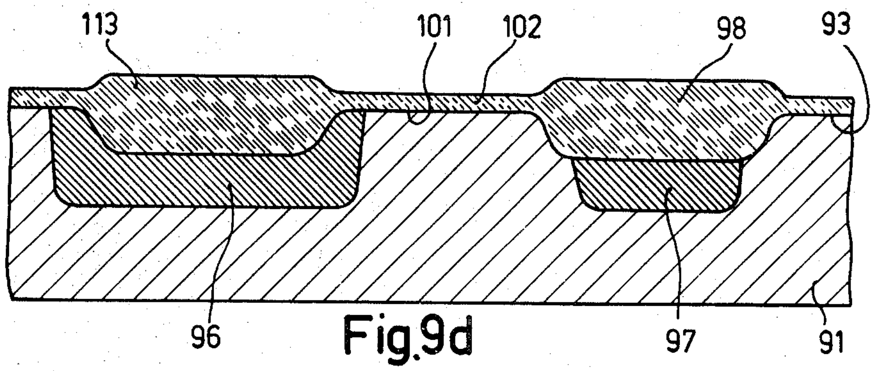

FIGS. 9*b* to 9*d* are cross-sectional views corresponding to that shown in FIG. 9*a* in a number of stages during the manufacture of the field effect transistor as shown in FIG. 9*a*.

Figure 9E:
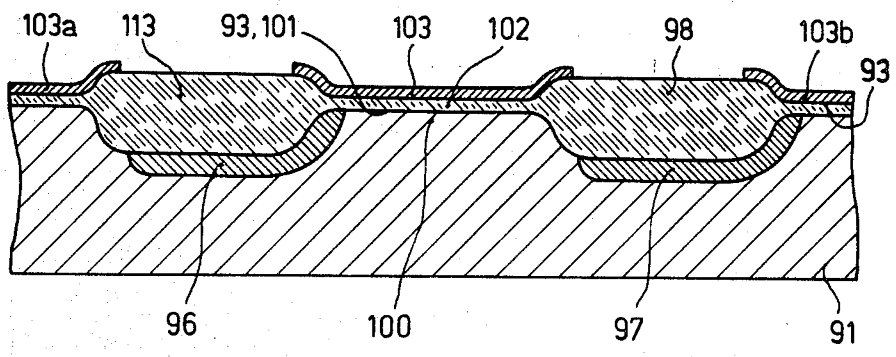

FIG. 9*e* is a cross-sectional view of an insulated gate field effect transistor which is slightly varied relative to the field effect transistor shown in FIG. 9*a* and which is also manufactured by using a method according to the invention.

Figure 10A:
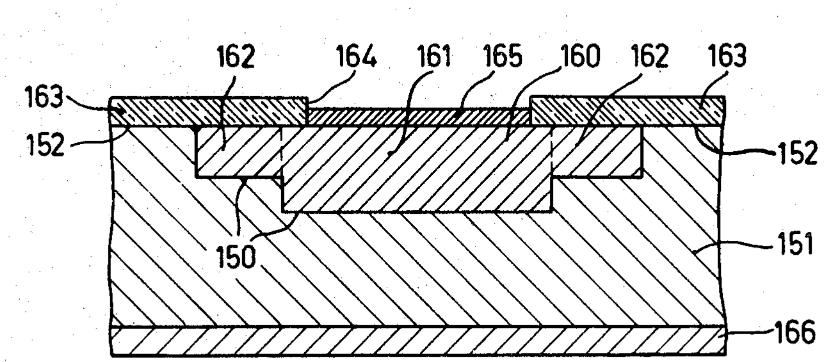

FIG. 10*a* is a cross-sectional view of a semiconductor device comprising a diode junction having an increased breakdown voltage.

Figure 10B:
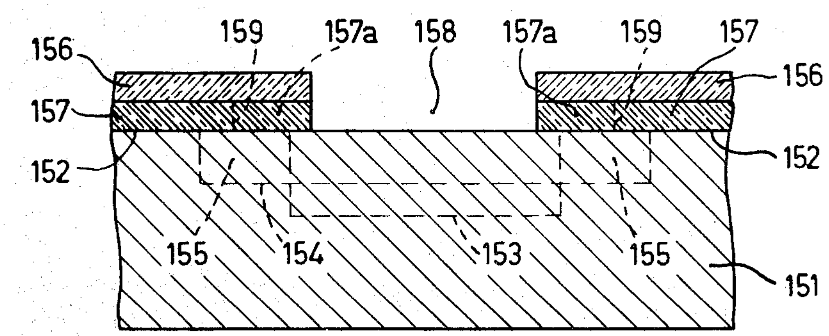

FIG. 10*b* is a cross-sectional view corresponding to that shown in FIG. 10*a* during the manufacture of the semiconductor device shown in FIG. 10*a* by means of a method according to the invention.

Figure 11A:
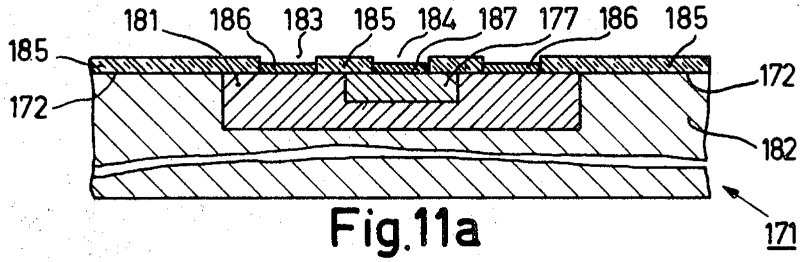

FIG. 11*a* is a cross-sectional view of a transistor manufactured by using a method according to the invention.

Figure 11B:
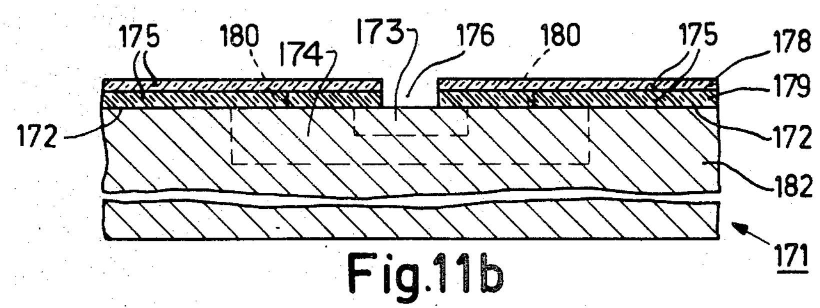

FIG. 11*b* is a corresponding cross-sectional view during the manufacture of the transistor structure shown in FIG. 11*a*.

Figure 12A:
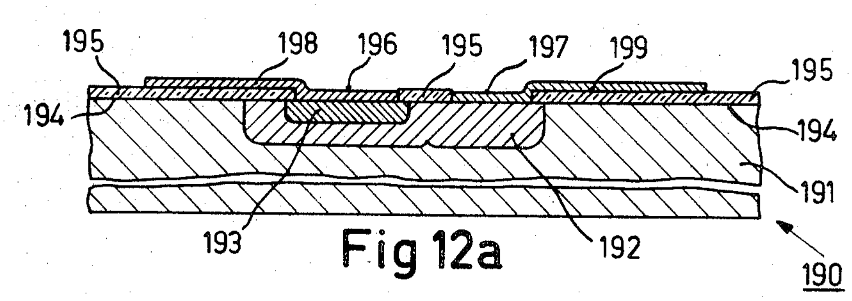

FIG. 12*a* is a cross-sectional view of another transistor manufactured by using a method according to the invention.

FIG. 12*b* to 12*f* are cross-sectional views corresponding to that shown in FIG. 12*a* in a number of stages of the manufacture of the transistor shown in FIG. 12*a*.

Figure 13A:
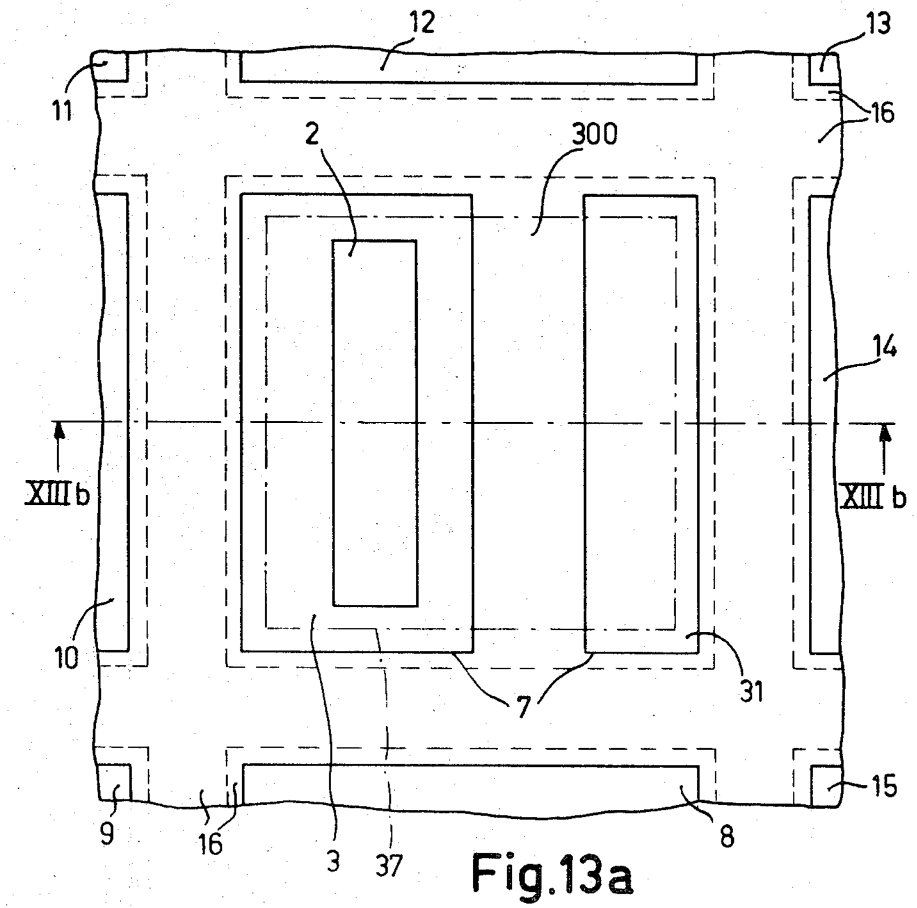

FIG. 13*a* is a plan view of a part of an integrated semiconductor device manufactured by means of a method according to the invention.

Figure 13B:
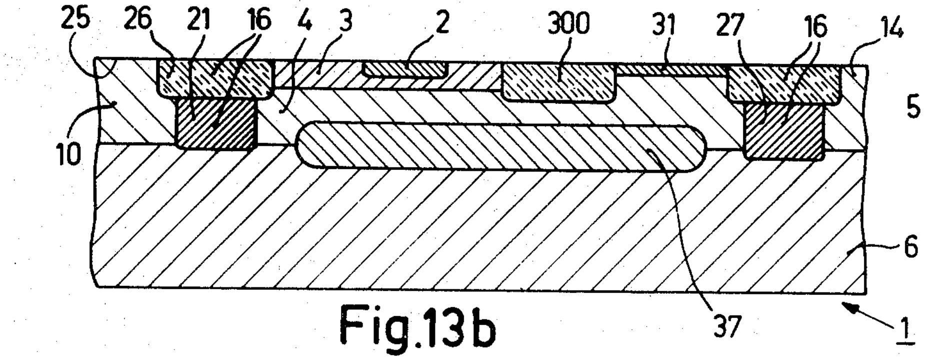

FIG. 13*b* is a cross-sectional view of said semiconductor device taken on the line XIII*b*—XIII*b* in FIG. 13*a*.

FIGS. 13*c* and 13*e* to 13*h* are cross-sectional views corresponding to that shown in FIG. 13*b* in a number of stages during the manufacture of the semiconductor device shown in FIG. 13*a* and 13*b*.

Figure 13C:
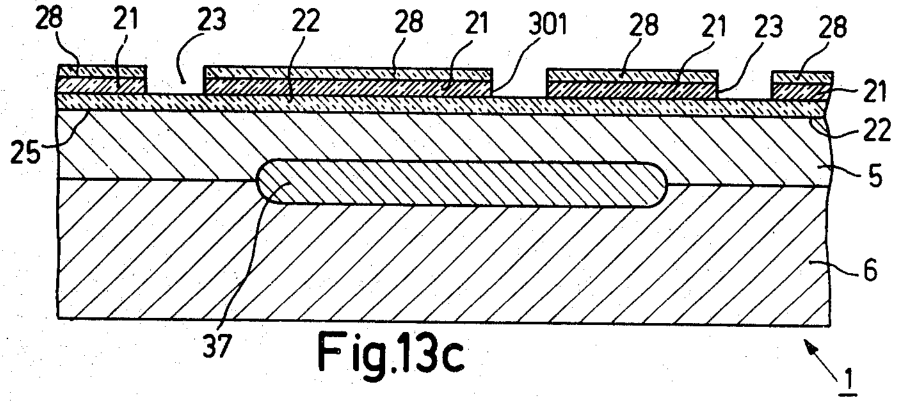
Figure 13D:
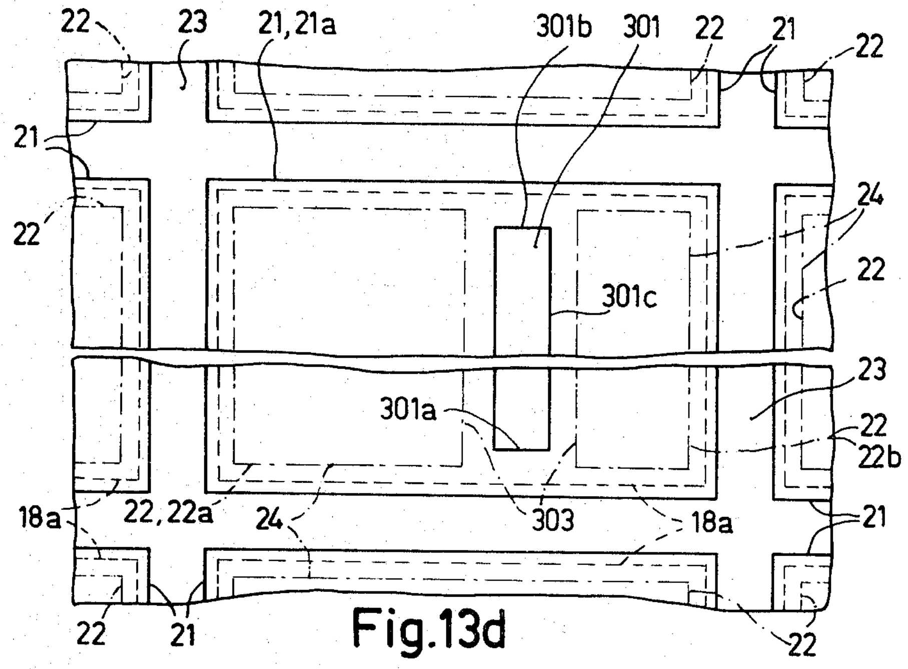
Figure 13E:
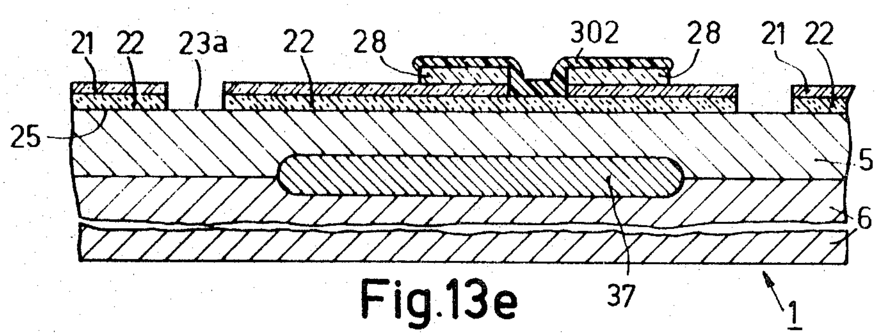

FIG. 13*d* is a plan view corresponding to that shown in FIG. 13*a* during the manufacture of the semiconductor device.

Figure 14A:
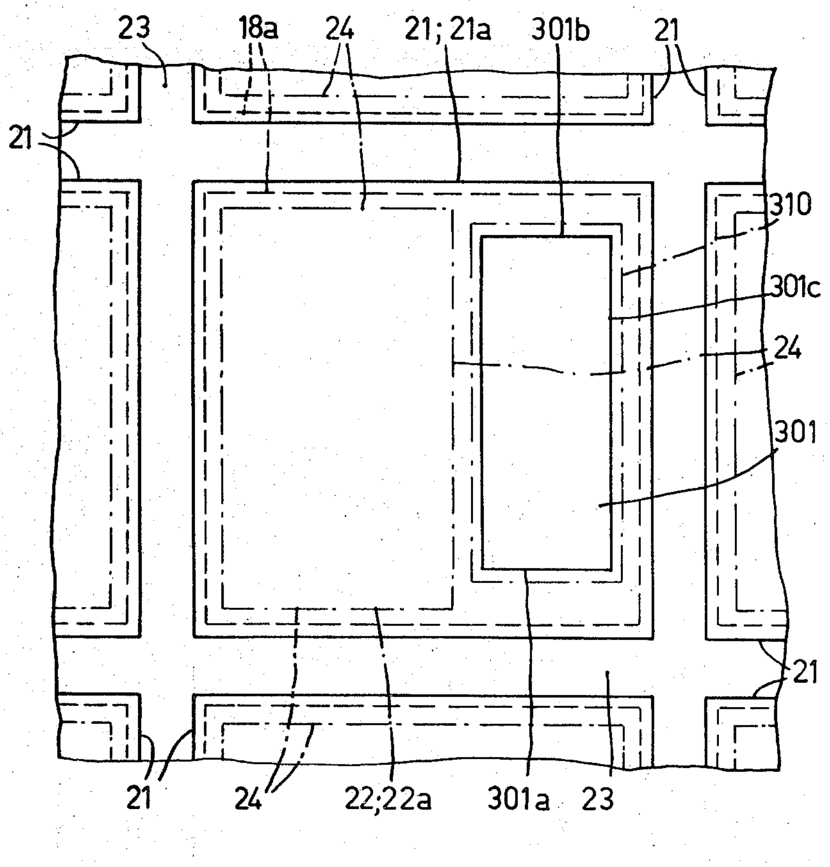

FIG. 14*a* is a plan view of a part of another integrated semiconductor device during the manufacture thereof.

Figure 14B:
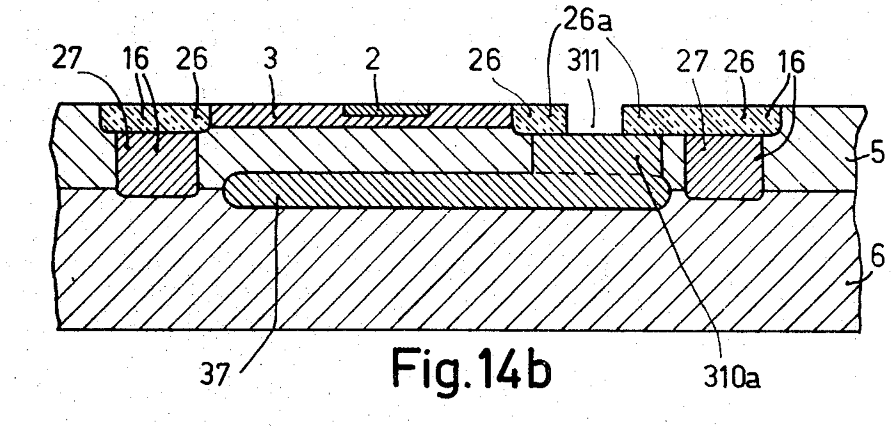

FIG. 14*b* is cross-sectional view of said other integrated semiconductor device.

Figure 15A:
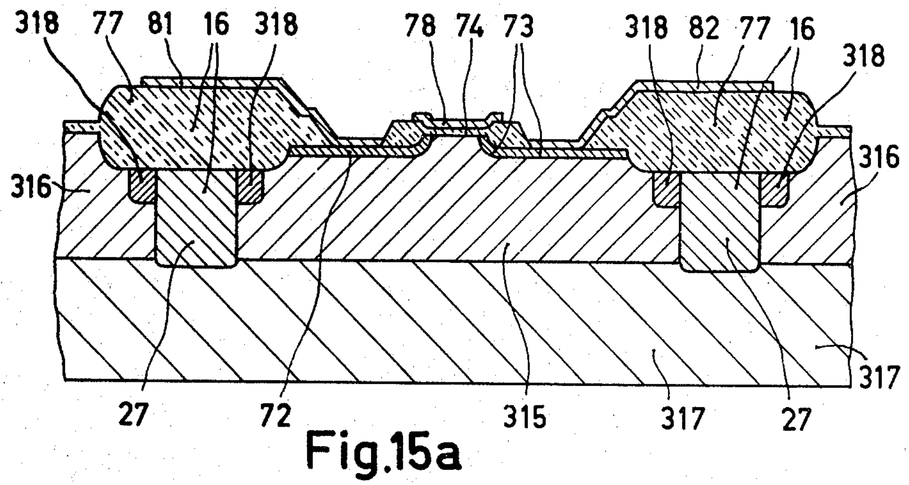

FIG. 15*a* is a cross-sectional view of a semiconductor device which is slightly varied with respect to the device shown in FIG. 8 and is manufactured by using a method according to the invention.

Figure 15B:
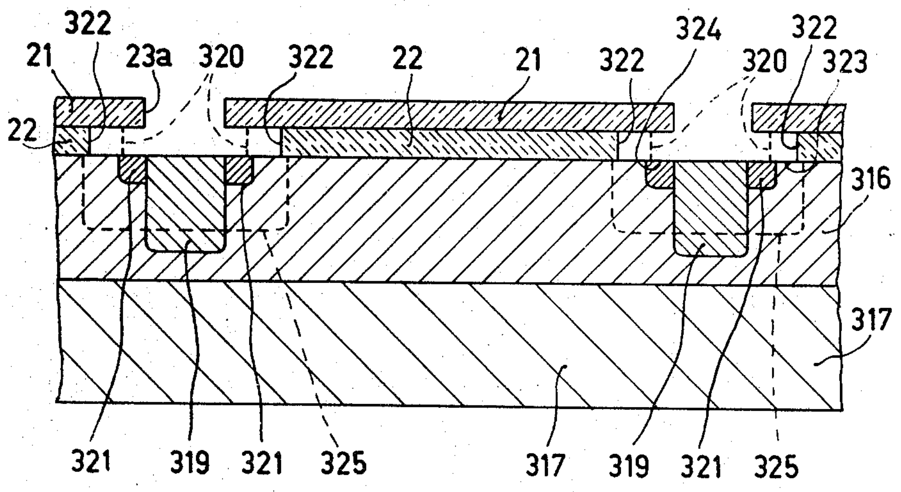

FIG. 15*b* is a cross-sectional view corresponding to that shown in FIG. 15*a* during the manufacture of the semiconductor device.

First of all, a method according to the invention of manufacturing a semiconductor device shown in FIGS. 1 and 2*h* will be described.

These figures show a part of an integrated circuit comprising a semiconductor body 1 having islands 7 to 15 in which circuit elements, for example transistors, are provided in the islands. The islands are electrically isolated from each other by isolation zones 16 which consist partly of an insulating material 26 and partly of a doped zone 27.

The method according to the invention is used to obtain the isolation zones 16 in which, via a surface part 17 of the semiconductor body 1 defined by a mask 35 (FIG. 2*e*), termed the small surface part, the electric properties of a zone 18 of the semiconductor body 1 adjoining said small surface part, hereinafter termed small zone, are varied and in which via a surface part 19 likewise defined by a mask 36 (FIG. 2*f*), termed the large surface part, which is larger than the small surface part 17 and comprises same, the electrical properties of a zone 20 of the semiconductor body 1 adjoining said large surface part 19, hereinafter termed the large zone, are varied.

On the surface 25 of the semiconductor body 1 a masking layer is provided which consists at least of two component layers of different materials, namely, viewed on the masking layer, an uppermost component layer 21 (FIG. 2*b*), termed top layer, and an adjoining component layer 22, termed intermediate layer.

For carrying out the treatment to vary the electrical properties of the small zone 18, at least the top-layer 21—in the present embodiment, however, both the top-layer 21 and the intermediate layer 22—is provided with an aperture 23*a* (FIG. 2*e*), termed small aperture, which defines the small surface part 17.

For carrying out the treatment to vary the electrical properties of the large zone 20, the intermediate layer 22 is provided with an aperture 24 (FIG. 2*f*), termed large aperture, which defines the large surface part 19 of the semiconductor body 1.

The large aperture 24 is provided by selectively etching the intermediate layer 22, the top layer 21 masking against said etching treatment and the intermediate layer 22 being removed from the aperture 23 in the top layer 21 to below the top layer 21 over a distance which is larger than the thickness of the intermediate layer 22. (The thickness of the layers are shown exaggerated in the drawing.)

As a result of this it is achieved that an accurate structure is obtained without an accurate and time-consuming intermediate alignment step and while using only one photomask.

In the present example a masking layer is used which masks the underlying semiconductor material both against doping with an impurity and against oxidation.

The electrical properties of the small zone 18 are varied by introducing an impurity in the zone 18 via the small aperture 23*a*, for example by diffusion, as a result of which a diffused zone 18*a* is obtained as is shown in FIG. 2*f*.

The electrical properties of the large zone 20 (FIG. 2*f*) are varied by oxidizing said zone by means of an oxidation treatment via the large aperture 24. As a result of this an oxide layer 26 is obtained which is inset in the semiconductor body 1 over at least a part of its thickness.

During the oxidation treatment, the impurity provided in the small zone 18 diffuses deeper in the semiconductor body 1 as a result of which a doped zone 27 is obtained locally below the oxide layer 26.

It is to be noted that it is also possible for the small zone 18, and hence also for the diffused zone 18*a*, to extend throughout the thickness of the epitaxial layer 5.

If an impurity is introduced into the small zone 18 by means of ion implantation instead of by diffusion, it is possible to provide the large aperture 24 in the intermediate layer 22 prior to the ions implantation, the part of the large surface part 19 which surrounds the small surface part 17 being masked by the parts 29 (FIG. 2*f*) of the top layer 21 projecting above the large aperture 24. In addition it is possible to provide only a small aperture 23 only in the top layer 21 prior to the ion implantation, as is shown in FIG. 2*d*, if the top layer 21 masks against the ion implantation and the intermediate layer 22 does not.

In the present example, however, the electrical properties of the small zone 18 are varied by means of diffusion of an impurity via the small aperture 23*a* prior to providing the intermediate layer 22 with the large aperture 24.

The intermediate layer 22 is removed from below the top layer 21 to such an extent that due to the oxidation of the large zone 20 an inset oxide layer 26 is obtained which, viewed in a direction perpendicular to the surface 25 of the semiconductor body 1, projects beyond said zone along the circumference of the adjoining doped zone 27.

Due to this, the doped zone 27 does not occupy extra space at the surface 25 of the semiconductor body 1 so that inter alia a compact structure of the semiconductor device to be manufactured is possible.

The semiconductor body 1 used comprises a surface layer 5 (FIG. 2*a*) of one conductivity type adjoining the surface 25 to be masked of the semiconductor body 1, and a part 6, termed substrate, of the opposite conductivity type adjoining said surface layer 5.

The surface layer 5 is divided into a number of islands 7 to 15 (FIGS. 1, 2*h*) by means of the isolation zones 16.

The doped zone 27 adjoining the oxide layer 26 which is inset in the semiconductor body 1 over at least a part of its thickness is provided in the surface layer 6 as a zone of the opposite conductivity type.

The inset oxide layer 26 and the doped zone 27 adjoining the oxide 26 are thus provided in the form of a pattern in which they surround the islands 7 to 15 and constitute the isolation zones 16.

Circuit elements of which one or several zones laterally adjoin the inset oxide 26 and hence the isolation zones may be provided in the islands as a result of which a space saving is obtained.

The starting material in the present example is a p-type substrate 6 of silicon having a resistivity of approximately 2 to 5 ohm/cm. and a thickness of approximately 250 μm.

The remaining dimensions are kept large enough to obtain the desired number of islands of the semiconductor device to be manufactured which are isolated from each other.

It is to be noted that usually several semiconductor devices are simultaneously manufactured in the semiconductor body 1 which are separated in a later stage of the manufacture.

In a manner conventionally used in semiconductor technology, a surface layer 5 in the form of an n-type epitaxial layer is provided on the substrate 6 (FIG. 2*a*), the resistivity of said layer being 0.2 to 0.6 ohm/cm. and its thickness being approximately 3 μm.

A masking layer which is constituted by the top layer 21 of silicon nitride and the intermediate layer 22 of silicon oxide is then provided on the surface 25 of the semiconductor body 1 (FIG. 2*b*).

The layer 22 has a thickness of approximately 700 A. and is obtained in normal manner by heating the semiconductor body 1 at approximately 1000° C. in an oxidizing medium. By pyrolytic deposition, the silicon nitride layer 21 whose thickness is approximately 1500 A. is then provided on the silicon oxide layer 22 in the usual manner.

On the top layer 21 of the masking layer an etching mask 28 is provided which during the provision of the small aperture 23 in the top layer 21 masks the underlying silicon nitride of the top layer 21 locally against the etching treatment.

The etching mask 28 consists, for example, of silicon oxide and is obtained in the usual manner by deposition of silicon oxide.

By means of the etching mask 28, the top layer 21 is then provided with the small aperture 23 by etching, which aperture already defines the small surface part 17 of the semiconductor body 1 (FIG. 2*d*).

Via the small aperture 23 in the top layer 21 and the small surface part 17, the small zone 18 adjoining the small surface part 17 may then be doped, for example by diffusion of gallium or by ion implantation, with an impurity to obtain a p-type zone.

In the present example, however, first the silicon oxide of the intermediate layer 22 present above the small surface part 17 is removed by means of a selective etching treatment via the small aperture 23 in the top layer 21, as a result of which the small aperture 23*a* of the mask 35 (FIG. 2*e*) is obtained, after which the electrical properties of the small zone 18 are varied by diffusing boron in the small zone 18 via the small aperture 23*a* to obtain the diffused p-type zone 18*a* (FIG. 2*f*).

It is to be noted that during the etching treatment of the intermediate layer 22 the etching mask 28 which also consists of silicon oxide is removed at the same time fully or partly in accordance with the thickness thereof.

After the doping, the intermediate layer 22 is provided with a large aperture 24 (FIG. 2*f*) which defines the large surface part 19 of the semiconductor body 1, by again subjecting the intermediate layer 22 to a selective etching treatment via the small aperture 23*a*.

In this case the intermediate layer 22 is removed from the small aperture 23*a* to below the top layer 21 over a distance which is larger than the thickness of the intermediate layer 22, for example, a distance of 3 μm.

By heating at approximately 1000° C. in an oxidizing medium, the large zone 20 is then oxidized as a result of which the oxide layer 26 is obtained which is inset in the semiconductor body 1 over a part of its thickness and projects partly above the surface 25 of the semiconductor body 1.

The thickness of the oxide layer 26 is approximately 2μ and is inset in the epitaxial layer 5 over approximately 1μ (FIG. 2*h*).

During the oxidation treatment, the boron atoms provided in the small zone 18 diffuse deeper in the semiconductor body 1 and constitute below the oxide layer 26 a p-type doped zone 27 adjoining the oxide layer.

The oxide layer 26 and the doped zone 27 which is denoted by broken lines in FIG. 1 are provided in the form of a pattern in which they surround the islands 7 to 15 of the epitaxial layer 5 (FIG. 1) and, in the present example in which the doped zone 27 extends up to the substrate 6, constitute the isolation zones 16.

Circuit elements may now be provided in the islands 7 to 15 which are efficiently isolated from each other laterally by the isolation zones 16. In the present example a transistor is provided in the island 7 having an emitter zone 2 and a base zone 3 which are provided in the usual manner by the diffusion of impurities and having a collector zone 4 which is constituted by the island 7 itself.

The masking layer consisting of the top layer 21 and the intermediate layer 22 may be used for the necessary diffusion masks.

In the present example, however, said masking layer is first removed, after which a silicon oxide layer 30 is provided on the surface 25 of the semi-conductor body 1, which silicon oxide layer is used in the usual manner for the necessary diffusion masks by means of which the p-type base zone 3 and the n-type emitter zone 2, respectively, and an n-type collector contact zone 31 are provided by the diffusion of boron and phosphorus, respectively.

The base zone 3 the thickness of which is approximately 0.6 μm. and the collector contact zone 31 laterally adjoin the inset oxide layer 26 as a result of which a compact structure of the semiconductor device to be manufactured is possible.

The emitter zone 2 has a thickness of approximately 0.3 μm. and, if desirable, may also laterally adjoin the inset oxide layer 26.

The collector contact zone 31 is provided simultaneously with the emitter zone 2 and has the same conductivity type as but a higher doping than the collector zone 4 which is constituted by the epitaxial layer 5.

The silicon oxide layer 30 is then provided with apertures 32, 33, 34 so as to be able to contact the zones 2, 3 and 31. These apertures are shown in broken lines in FIG. 1.

The contacts are not shown for simplicity and may be provided in the usual manner in the form of metal layers which may extend over the inset oxide layer 26.

Many variations can advantageously be applied to the example described.

For example, a buried collector layer of the same conductivity type as but having a higher doping than the collector zone 4 may be provided in the usual manner.

Such a buried layer is shown in FIG. 2*h* by broken lines at 37.

Furthermore it is possible to provide a doped zone 27 which extends only in the proximity of the substrate 6, in which during operation of the semiconductor device the depletion layer of the p-n junction between the substrate 6 and the epitaxial layer 5 reaches the doped zone 27 and thus completes the island isolation.

After providing the large aperture 24 in the intermediate layer 22 (see FIG. 2*f*) a structure is obtained in the present example in which parts 29 of the top layer 21 extend which project above the parts of the large surface part 19 surrounding the small surface part 17, said parts having no masking function during the oxidation treatment of the large zone 20.

Since, however, during the oxidation the oxide layer 26 grows also above the surface 25 of the semiconductor body 1, it is possible, in particular when the thickness of the oxide layer 26 to be provided is large and/or the thickness of the intermediate layer 22 is small, that the projecting parts 29 of the top layer 21 yet again exert a masking action with a given thickness of the oxide already obtained.

In this case it may be advantageous to obtain an oxide layer 26 of a good quality to remove the projecting parts 29, for example, by means of ultrasonic vibrations, prior to carrying out the oxidation treatment of the large zone 20. Such ultrasonic vibration can advantageously be carried out during the selective etching treatment to obtain the large aperture.

In the present example, however, the top layer 21 is subjected to a selective etching treatment after providing the large aperture 24 and prior to providing the inset oxide layer 26, said layer being removed from the top up to approximately half its thickness.

The projecting parts 29 of the top layer 21 are also subjected at its bottom and end, via the large aperture 24 in the intermediate layer 22, to the same etching treatment and therefore are fully removed. The broken lines 38 in FIG. 2*f* denote the boundary of the remaining top layer. The occurring reduction in thickness of the top layer should already be taken into account during provision of the top layer 21.

The top layer 21 and the intermediate layer 22 are subjected to selective etching treatments, that is to say that etchants are used which attach the component layer, which is to be etched selectively, considerably more rapidly than the other component layer. Phosphoric acid may be used for the selective etching treatment of the component layer of silicon nitride, and hydrofluoric acid may be used for selectively etching the component layer of silicon oxide. Neither of these etchants significantly attack any exposed silicon present.

Reference is also made to U.S. Pat. 3,544,858; Canadian Pat. 826,343; and Philips Research Reports, 25, 118–137, April 1970, for further details concerning various methods for insetting or sinking an oxide into a silicon wafer.

FIG. 3*a* is a cross-sectional view of a semiconductor device of the same type as that shown in FIGS. 1 and 2*h*. The plan views of these semiconductor devices are the same. The difference between the semiconductor devices relates to the isolation zones 16 which in the device shown in FIG. 3*a* consist only of insulating silicon oxide 126. Below these isolation zones 16 of silicon oxide 126, p-type doped zones 127 are provided in the p-type substrate which serve as channel stoppers. The zones 127 are for that purpose more highly doped than the substrate 6.

This semiconductor device may be obtained, for example, by continuing, in the method of manufacturing the device shown in FIGS. 1 and 2*h*, the oxidation treatment to obtain the inset silicon oxide layer 26 (see FIGS. 2*f* and 2*g*) for such a period of time until the inset oxide layer extends at least throughout the thickness of the epitaxial layer 5 and the inset oxide layer 126 shown in FIG. 3*a* is obtained, the doped zone 27 shown in FIG. 2*g* being present in the substrate 6 as the zone 127 (FIG. 3*a*).

In that case, however, an inset oxide layer is obtained which projects above the surface 25 of the semiconductor body 1 over approximateiy half its thickness.

Figure 3C:
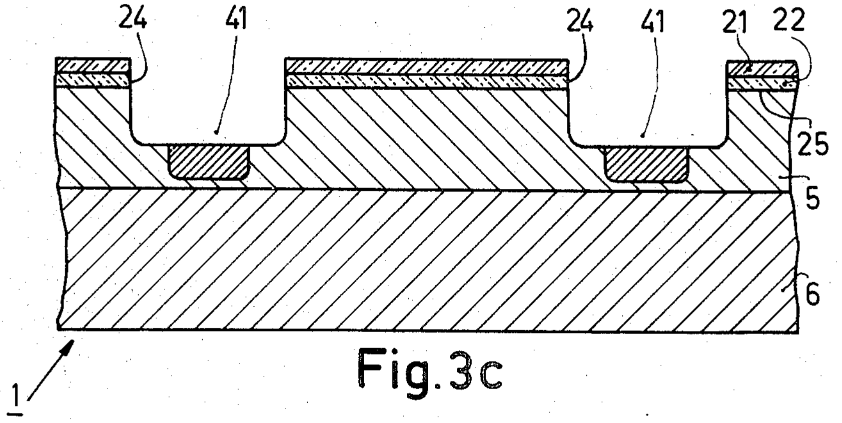

It is also possible, however, to interrupt the oxidation treatment when an inset silicon oxide layer **126*a*** (see FIG. 3*b*) is obtained which extends approximately over half the thickness of the epitaxial layer 5, then to remove the layer **126*a*** by etching, as a result of which the structure shown in FIG. 3*c* with the recesses 41 is formed, and then again to oxidize in which the recesses are filled with silicon oxide and the isolation zone 16 of silicon oxide 126 shown in FIG. 3*a* are obtained. In this case a semiconductor device having a substantially plane surface is obtained. The isolation zone excepted, the semiconductor device shown in FIG. 3*a* is manufactured in the same manner as the semiconductor device shown in FIGS. 1 and 2*h*. The larger zone converted into insulating material is denoted by broken lines **20*a*** in FIG. 3*b*.

So in this case the doped zone 127 adjoining the inset oxide layer 126 is constructed as a channel stopper of the same conductivity type as but having a higher doping than the part of the substrate 6 surrounding the zone 127.

FIG. 4*a* is a cross-sectional view of another type of isolation zone 16 which can be obtained by means of a method according to the invention. This type of isolation zone enables the use of a thick epitaxial layer 5 while avoiding prolonged oxidation.

This type of isolation zone is obtained as follows. A recess 141 is provided via the small aperture **23*a* in the layers 21 and 22 of the mask 35 by etching in the epitaxial layer 5** (see FIG. 4*b*). A p-type impurity, for example boron, is then diffused in the small zone 118 adjoining the small surface part 117 defined by the mask 35, and the large aperture 24 is provided by a selective etching treatment of the silicon oxide layer 22 with which the structure as shown in FIG. 4*c* is obtained having the p-type diffused zone **118*a* and having the large surface part 119 defined by said aperture to which the large zone 120 adjoins. The large zone 120 is then converted into silicon oxide by an oxidation treatment and the isolation zone 16 consisting of the inset silicon oxide 126 and the adjoining doped p-type zone 127 is obtained. In this case it is possible to provide a silicon oxide layer 126 which extends throughout the thickness of the n-type epitaxial layer 5, in which the p-type zone 127 becomes located for the greater part as a channel stopper in the p-type substrate 6**.

It is also possible first to provide a diffused p-type zone via the aperture **23*a* and to etch in said zone a recess with which, after providing the large aperture 24**, the structure is shown in FIG. 4*c* is obtained.

Another possibility of obtaining an isolation zone will be described with reference to FIG. 5*a* to 5*c*. Via the aperture **23*a*** (see FIG. 5*a*) in the mask 35, a p-type impurity, for example boron, is diffused in the small zone 118 after which the large aperture is provided by selectively etching the intermediate layer 22 of the mask 35 and a recess 142 is etched via said aperture in the epitaxial layer 5 which extends to a smaller depth in the epitaxial layer 5 than the small zone 118, with which the structure as shown in FIG. 5*b* is obtained having the diffused p-type zone 143 below the recess 142. The isolation zone 16 (see FIG. 5*c*) is obtained by an oxidation treatment and consists of the silicon oxide layer 144 which is inset substantially throughout its thickness and the adjoining doped p-type zone 145. The large zone 146, denoted by broken lines in FIG. 5*b*, has thus been converted into an insulating part 144 of silicon oxide by a combination of an etching process and an oxidation treatment.

A few embodiments of the method according to the invention will now be described in which the doped zone adjoining the inset oxide layer is constructed as a channel-interrupting zone, for which purpose it is provided as a zone of the same conductivity type as and having a higher doping than the part of the semiconductor body surrounding the zone.

First of all a method of manufacturing the semiconductor device shown in FIGS. 6 and 7 will be described. In this method a semiconductor body 51 is used of which at least the part adjoining the surface 54 to be masked is of one conductivity type and the inset oxide layer with the adjoining doped zone 53 is provided in said part. In a direction perpendicular to the surface 54, the oxide layer 52 shows an aperture 55 which is fully surrounded by the doped zone 53, in which in the said part of the semiconductor body 51 a surface zone 56 of a semiconductor circuit element is formed at the region of the aperture 55, which zone adjoins, at least along a part of its circumference, the oxide layer 52 surrounding the aperture 55. In the present embodiment the part of the one conductivity type is the semiconductor body 51 itself.

FIGS. 6 and 7 show a photosensitive target of the type which is used in camera tubes and consists of an n-type silicon body 51 having a number of juxtaposed p-type surface zones 56 which are separated from each other. Therefore, an inset oxide layer 52 is provided during the manufacture, which layer comprises a number of apertures 55 in which, viewed on the surface 54, each aperture 55 is fully surrounded by the channel-interrupting zone 53. In each aperture 55 is provided a p-type surface zone 56 which, along its full circumference, adjoins the inset oxide 52 and forms a p-n-junction 57 with the underlying semiconductor material, said junction extending substantially parallel to the surface 54 in the semiconductor body 51.

The provision of the channel-interrupting zone 53 and the inset oxide layer 52 can be carried out in a manner similar to the provision of the zone 27 and the oxide layer 26 shown in FIG. 2*h*, or to the zone 127 and the oxide layer 126 shown in FIG. 3*a*, or to the zone 127 and the oxide layer 126 shown in FIG. 4*a*, or to the zone 145 and the oxide layer 144 shown in FIG. 5*c*, with the difference that in this case an impurity is provided in the small zone, as a result of which only the impurity concentration in the small zone is increased but the conductivity type does not vary. In the present embodiment, for example, arsenic may be used for said impurity.

It is to be noted that after providing the doped zone 53 and the inset oxide layer 52, the oxide layer 52 is used as a diffusion mask for providing the diffused p-type surface zones 56. The zones 56 may also be provided, for example, by ion implantation, the oxide layer 52 masking the underlying semiconductor material against ion implantation.

The channel-interrupting zones 53 prevent the occurrence of p-type uninterrupted surface channels adjoining the inset oxide layer 52 and hence electric connections between zones 56.

It will be obvious that the target can still be subjected to further operations for providing usual zones, layers and electrodes, for example, a high-ohmic layer over the inset oxide 52 and over the p-type zones 56. Furthermore, the semiconductor body may be made thinner, for example, locally, in a usual manner.

FIG. 8*a* shows an insulated gate field effect transistor. This transistor comprises an n-type silicon body 71 comprising the p-type source zone 72 and the p-type drain zone 73 between which the channel region 74 is present. A thin silicon oxide layer 75 is present on said channel region and a thicker silicon oxide layer 76 is present on the source and drain zones. The oxide layers 75 and 76 are surrounded by an even thicker inset silicon oxide layer 77. The gate electrode 78 is present on the thin oxide layer 75. Apertures 79 and 80 are provided in the oxide layer 76 through which metal layers 81 and 82 are connected to the source and drain zones 72 and 73, which layers extend to over the inset oxide layer 77. Below the inset oxide layer 77 a channel-interrupting zone 83 is provided which is of the same conductivity type as but has a higher doping than the silicon body 71.

The structure shown in FIG. 8*a* inter alia has the advantage of very small stray capacitances and is particularly simple to manufacture without a precision masking step by means of a method according to the invention.

Starting material in the manufacture of the field effect transistor is an n-type silicon body 71 in which, in a manner similar to that described with reference to the preceding embodiment, an inset silicon oxide layer 77 is provided which comprises an aperture 84 (see FIG. 8*b*) and has an n-type doped zone 83 adjoining the inset layer 77 which is more highly doped than the silicon body 71 and may hence serve as a channel-interrupting zone and which surrounds the aperture 84. The inset silicon oxide layer 77 is inset in the body 71 over part of its thickness but may also be provided so as to be inset in the body 71 substantially throughout its thickness.

The structure shown in FIG. 8*b* is obtained in which the mask used during the provision of the inset oxide layer 77 is still present on the surface 86 of the semiconductor body 71. FIG. 8*b* shows this mask 85 which is already provided with the apertures 87 and 88 adjoining the inset oxide layer 77 at the region of the source and drain zones 72 and 73 to be provided.

The source and drain zones 72 and 73 are then provided in the semiconductor body 71 by diffusion or ion-implantation of an impurity via the apertures 87 and 88, and the silicon oxide layer 76 which is inset in the semiconductor body 71 over at least a part of its thickness is provided at the region of the apertures 87 and 88 by an oxidation treatment. The source and drain zones 72 and 73 are surface zones which, along a part of their circumference, adjoin the oxide layer 77 surrounding the aperture 84.

The gate electrode 78 may be provided on the part of the mask 85 present between the source and drain zones 72 and 73. In the present embodiment, however, this mask is removed and replaced by a silicon oxide layer 75.

After providing the apertures 79 and 80, the metal layers 78, 81 and 82 may be provided in a conventional manner.

By means of a method according to the invention, a channel-interrupting zone 83 below the inset oxide 77 is obtained in a simple manner, which zone is separated from the source and drain zones 72 and 73.

The thickness of the silicon oxide layer 77 is approximately 2 μm., that of silicon oxide layer 76 is approximately 0.5 μm. and that of the silicon oxide layer 75 is approximatelly 0.15 μm.

An important type of insulated gate field effect transistor comprises a gate electrode the active part of which, which is separated from the channel region by a thin insulating layer, does not reach up to the drain zone. In other words, there is a distance between the active part of the gate electrode and the drain zone. This distance must be accurately determined, which imposes high requirements upon the accuracy with which the drain zone and the gate electrode are provided relative to each other. The desirable accuracy can be obtained in a simple manner by means of a method according to the invention.

FIG. 9*a* shows such an offset gate field effect transistor which has been obtained by means of a method according to the invention.

Starting material in the manufacture is a semiconductor body 91 of one conductivity type (or comprising a part of one conductivity type) in which two zones 96 and 97 of the opposite conductivity type are provided which constitute the source and drain zones of the transistor. The drain zone 97 is constructed as a doped zone obtained below the inset oxide layer 98. The channel region 100 is present between the source zone 96 and the drain zone 97. On the surface 101 of the semiconductor body 91 present between the source zone 96 and the inset oxide 98, an insulating layer 102 is provided which is thinner than the inset oxide 98 and the gate electrode 103 is provided on said thin layer. The gate electrode slightly overlaps the inset oxide layer 98 but the overlapping part is not deemed to belong to the active part of the gate electrode 103 which is present on the thin insulating layer 102, since the thicker oxide layer 98 restricts the capacitive effect of the overlapping part of the gate electrode 103.

Starting material is an n-type silicon body 91 (see FIG. 9*b*) on which a mask 92 is provided which consists of a top layer 105 of silicon nitride and an intermediate layer 106 of silicon oxide and which comprises the apertures 107 and 108. A p-type impurity is diffused in the small zone 94 adjoining the aperture 107 via the aperture 107. Later-on the large zone 95 will be converted into silicon oxide. This p-type impurity is diffused in the semiconductor body 91 also via the aperture 108. The p-type zones 110 and 109 shown in FIG. 9*c* have then been obtained.

The aperture 108 is then closed by an etching mask 112 consisting, for example, of a photoresist layer. A precision masking technique is not necessary for this purpose.

The large aperture 111 is then provided by selectively etching the intermediate layer 106, the large zone 95 which will be converted into silicon oxide adjoining said aperture.

Afer removing the photoresist layer 112, the inset oxide layers 98 and 113 (see FIG. 9*d*) are provided by an oxidation treatment, the impurities in the zones 109 and 110 diffusing further in the semiconductor body, and the p-type doped zone 96 which in the semiconductor body fully surrounds the inset oxide layer 113, and the p-type zone 97 which is present below the inset oxide layer 98 being obtained. The method according to the invention enables the distance between the edge of the inset oxide layer 98 and the underlying p-type zone 97 to be accurately determined.

The mask comprising the component layers 105 and 106 is then removed and replaced by a thin silicon oxide layer 102 which is thinner than the inset oxide layers 98 and 113.

After providing the apertures 90 and 99, the metal layers 114, 115 and 103 can be provided in a conventional manner so that the field effect transistor shown in FIG. 9*a* is obtained.

The inset oxide layers 98 and 113 which can also be inset in the body 91 throughout their thickness, have a thickness of approximately 2 μm. and the thin oxide layer 102 has a thickness of approximately 0.2 μm. The distance over which the intermediate layer 106 is removed by selective etching to below the top layer 105 is approximately 4μm. (see FIG. 9*c*).

Viewed on the surface 93, the gate electrode 103, the inset oxide layer 113 and the source zone 96 can surround the inset oxide layer 98 and the drain zone 97.

It is to be noted that the source zone 96 and the inset oxide layer 113 are obtained simultaneously with the drain zone 97 and the inset oxide layer 98 which greatly simplifies the method. However, it is, for example, also possible to provide the source zone in a separate process step as a surface zone in which, for example, a non-inset oxide layer or an oxide layer which is inset to a smaller depth can be provided on said zone.

It is to be noted in addition that during the selective etching treatment of the intermediate layer 106 via the aperture 107 in the top layer 105 (see FIG. 9*c*), the masking layer 112 can mask only the right-hand part of the aperture 108 in the layers 105 and 106 while in addition the right-hand part of the aperture 107 may be masked.

A field effect transistor as shown in FIG. 9*e* is then obtained in which the source zones and the drain zones 96 and 97 comprise a left-hand part which is present entirely below the inset oxide layers 113 and 98 and a right-hand part which extends to the surface 93 of the semiconductor body 91. In this structure the source zone 96 may be the drain zone of a preceding field effect transistor and the drain zone 97 may be the source zone of a subsequent field effect transistor, in which the metal layers 119 and 115 may be superfluous. The gate electrodes of the preceding and the following field effect transistor are denoted by 103*a* and 103*b*.

A few examples of the method according to the invention will now be described in which a masking layer is used which masks the underlying semiconductor material of the semiconductor body against doping with impurities and in which the electrical properties of the small zone are varied by providing an impurity via the small aperture in said small zone, and the electrical properties of the large zone are varied by providing an impurity via the large aperture in said large zone.

First of all the manufacture of a p-n junction 150, see FIG. 10*a*, with increased breakdown voltage will be described.

Starting material is a semiconductor body 151 of one conductivity type (or having a region of one conductivity type) adjoining the surface 152 to be masked (see also FIG. 10*b*), in which the small zone 153 and the large zone 154 are present, in which zones an impurity will successively be diffused or implanted.

The small zone 153 extends from the surface 152 deeper in the body 151 than the large zone 154. By doping with an impurity, the conductivity type of the zones 153 and 154 will be converted from one into the other conductivity type, in which in the small zone 153 a higher surface concentration of the said impurity is provided than in the parts 155 of the large zone 154 surrounding said small zone 153.

In the present embodiment the semiconductor body 151 is an n-type silicon body. On the surface 152 a mask is provided having a top layer 156 of silicon nitride and an intermediate layer 157 of silicon oxide in which a small aperture 158 is provided.

In the present embodiment the impurities will be provided by diffusion.

A p-type impurity, for example boron, is diffused in the small zone. The surface concentration of said impurity is approximately $10^{18}$ boron atom/ccm.

By a selective etching treatment of the intermediate layer 157, the part 157*a* which extends from the aperture 158 up to the broken line 159, a distance of approximately 3 μm., is then removed and a p-type impurity, for example boron, is diffused in the large zone 154, the surface concentration in the parts 155 of the large zone being approximately $10^{17}$ boron atom/ccm. This surface concentration is lower than the surface concentration in the small zone 153 and preferably only slightly higher than the concentration of the n-type impurity in the starting body 151.

The p-type zone 160 is then obtained which consists of a central part 161 and a part 162 which surrounds said part and is more high-ohmic than the central part 161. This p-type zone 160 constitutes the p-n-junction 150 with the n-type body 151.

The more high-ohmic ring 162 has for its result that upon breakdown of the p-n-junction 150, said breakdown does not take place near the surface 152 which results in a more stable current-voltage characteristic.

After removing the mask used, a silicon-oxide layer 163 having an aperture 164 is provided on the surface 152. In this aperture a metal layer 165 is provided for contacting the p-type zone 160. Furthermore, the n-type body 151 may be provided with a metal layer 166, after which the semiconductor device shown in FIG. 10*a* is obtained which may be used as a diode or as a capacitor.

Zones of the same kind as the zone 160 may also be used for other applications. For example, such a zone may be constructed as an insulation zone of an integrated semiconductor device.

An embodiment of a method according to the invention will now be described for the manufacture of a bipolar transistor. Starting material is an n-type silicon body 171, see FIG. 11*b*, or a silicon body which comprises an n-type region which adjoins the surface 172 to be masked in which the small zone 173 and the large zone 174 are present. The large zone 174 extends to a greater depth in the body 171 than the small zone 173 and comprises the small zone 173.

By means of the mask 175 with the small aperture 176, the concentration of n-type impurities in the small zone is increased, for example, by diffusion of arsenic or ion implantation of arsenic ions, after which the emitter zone 177 shown in FIG. 11*a* is obtained.

The mask 175 again consists of a top layer 178 of silicon nitride and an intermediate layer 179 of silicon oxide. By selectively etching the intermediate layer 179, the large aperture 180 is obtained. Via said large aperture a p-type impurity, for example boron, is diffused in the large zone 174 in a concentration which lies between that of the arsenic concentration in the small zone 173 and that of the n-type impurity in the starting body 171, so that the part of the large zone 174 surrounding the small zone 173 obtained p-type conductivity and constitutes the base zone 181 as shown in FIG. 11*a*. The part 182 of the body 171 surrounding the base zone 181 constitutes the n-type collector zone of the transistor. After removing the layers 178 and 179, a silicon oxide layer 185 comprising the apertures 183 and 184 is provided on the surface 172 of the body 171. A base contact 186 and an emitter contact 187 are provided in said apertures.

The base and emitter zones 181 and 177, respectively, have thus been obtained by means of only one photomask, namely that photomask by means of which the small aperture 176 is obtained.

The base contact 186 surrounds the emitter contact 187. If a smaller base-collector capacity is desirable, the emitter zone preferably extends along a part of its circumference, directly near the edge of the base zone and the base contact mainly extends on one side beside the emitter zone. Such a transistor is shown in FIG. 12*a*. This transistor has an n-type collector zone 191, a p-type base zone 192 and an n-type emitter zone 193 present in a semiconductor body 190. On the surface 194 a silicon oxide layer 195 is provided which comprises apertures 196 and 197 via which apertures a metal layer 198 is connected to the emitter zone 193 and a metal layer 199 is connected to the base zone 192. Connection conductors can be connected to said metal layers.

This transistor may be manufactured as follows by means of a method according to the invention.

Figure 12B:
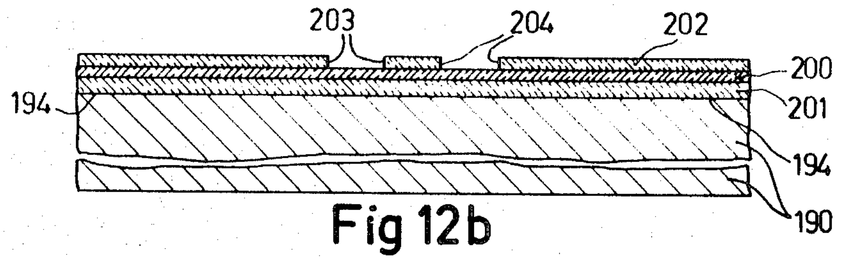
Figure 12C:
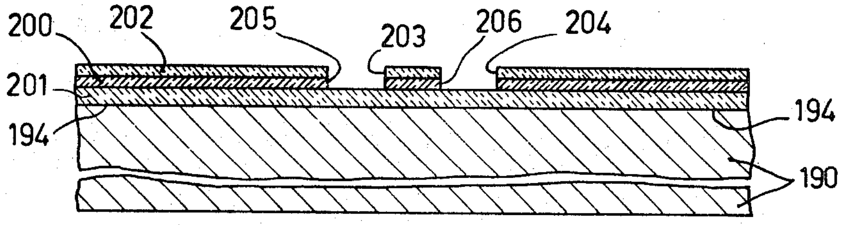

Starting material is an n-type silicon body 190, see FIG. 12*b*, on a surface 194 of which a masking layer is provided which consists of the top layer 200 of silicon nitride and the intermediate layer 201 of silicon oxide. An etching mask 202 consisting of a silicon oxide layer comprising two apertures 203 and 204 is provided on the top layer 200, after which by a selective etching treatment of the top layer 200 the apertures 205 and 206, see FIG. 12*c*, are provided in said layer.

Figure 12D:
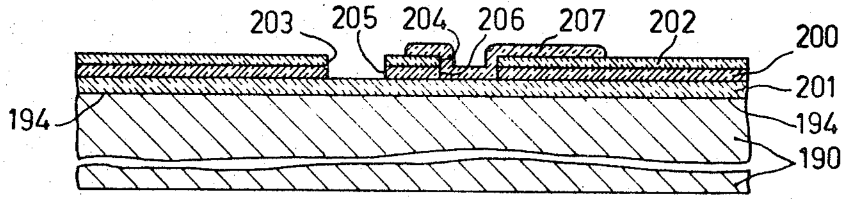
Figure 12E:
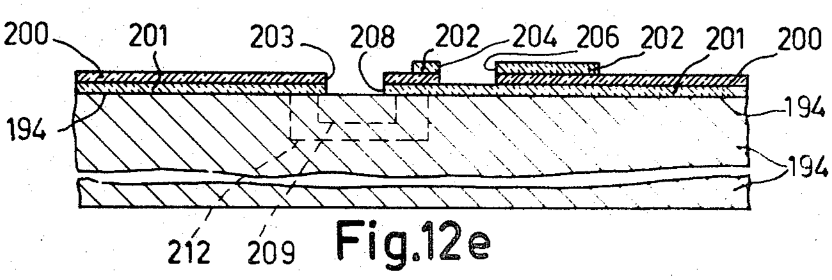

An etching mask 207, for example consisting of a photo-lacquer layer, see FIG. 12*d*, is then provided across the apertures 206 and 204. The provision of the etching mask 207 requires no precision photomasking step. By a selective etching treatment, the aperture 208 in the intermediate layer 201 of silicon oxide is provided, the parts of the silicon oxide layer 202 not covered by the etching mask 207 being etched away, and after removal of the etching mask 207 the structure shown in FIG. 12*e* is obtained.

Figure 12F:
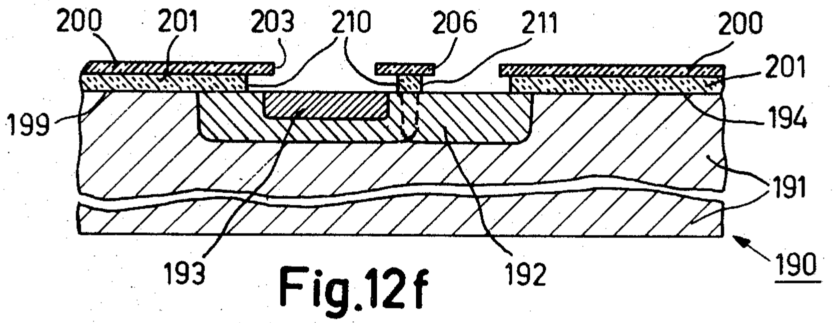

Via the apertures 203 and 208 in the layers 200 and 201, an emitter diffusion of the semiconductor body 190 is then carried out, in which, for example, arsenic is diffused in the small zone 209 and the n-type emitter zone 193 as shown in FIG. 12*f* is obtained.

By selectively etching the intermediate layer 201 of silicon oxide, the large aperture 210 is provided in said layer. During this the silicon oxide layer 202 is removed, see FIGS. 12*e* and 12*f*. Moreover, a further aperture 211 is formed in the intermediate layer 201 below the aperture 206 in the top layer 200, the aperture 211 being larger than the aperture 206.

Via the large aperture 210 a base diffusion in the semiconductor body 190 is carried out in the large zone 212, boron being diffused in the large zone 212. The diffusion is carried out in addition via the aperture 211 in the silicon body 190, the p-type base zone 192 shown in FIG. 12*f* being obtained.

It will be obvious that the distance between the apertures 203 and 206 in the top layer 200 and the distance over which during the selective etching treatment of the intermediate layer 201 same is removed below the top layer is to be chosen to be so that the distance between the apertures 210 and 211 to be obtained is small enough to cause the p-type diffused regions which adjoin said apertures and are to be obtained during the base diffusion, to overlap each other so as to obtain a cohering base zone 192. This distance may be, for example, a part of the thickness of the base zone 192 but it is alternatively possible to remove said layer between the apertures 203 and 206 entirely during the selective etching treatment of the intermediate layer 201, the apertures 210 and 211 in the intermediate layer 201 constituting a coherent aperture through which the base diffusion is carried out.

After providing the base zone 192, the top layer 200 and the intermediate layer 201 are removed and replaced by the silicon oxide layer 195, see FIG. 12*a*, in which the apertures 196 and 197 are provided. The metal layers 198 and 199 are then provided so that the transistor shown in FIG. 12*a* is obtained.

An embodiment of a method according to the invention of manufacturing an integrated semiconductor device having a transistor as shown in FIGS. 13*a* and 13*b* will now be described with reference to FIGS. 13*a* to 13*h*, in which during the selective etching treatment of the intermediate layer to obtain the large aperture, a coherent part of the intermediate layer is divided into at least two separated parts by said selective etching treatment.

The semiconductor device shown in FIGS. 13*a* and 13*b* is of the same type as that shown in FIGS. 1 and 2*h* and differs from said semiconductor device only in that between the base zone 3 of the transistor and the collector contact zone 31 a separation part 300 of silicon oxide inset in the semiconductor body 6 is present which adjoins the inset oxide layer 26 associated with the insulation zones 16, the base zone 3 and the collector contact zone 31 adjoining the inset oxide layers 27 and 300 along their full circumference.

Starting material is a silicon body 1, see FIG. 13*c*, having a p-type silicon substrate 6 on which an n-type epitaxial layer 5 is provided and which comprises an n-type buried layer 37 which is more highly doped than the epitaxial layer 5.

On the surface 25 to be masked, a masking layer is provided having a top layer 21 of silicon nitride and an intermeidate layer 22 of silicon oxide.

By means of an etching mask 28 of silicon oxide, the small aperture 23 and a further aperture 301 are provided in the top layer (see also FIG. 13*d*). The further aperture 301 is then masked with a photolacquer layer 302, see FIG. 13*e*, for which no precision masking technique is necessary, and the intermediate layer 22 is subjected to an etching treatment as a result of which the small aperture **23*a* in the masking layer (21; 22) is obtained. The parts of the etching mask 28 not present below the photolacquer layer 302** are also removed.

Figure 13F:
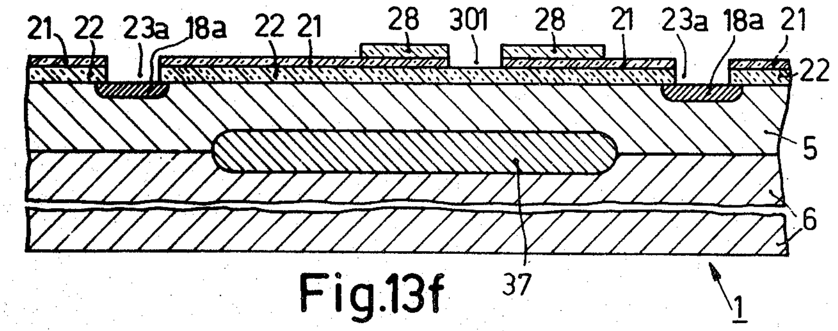

After removing the photolacquer layer 302, boron is diffused via the small aperture **23*a*, in a small zone adjoining said aperture, so that the p-type zone 18*a*** is obtained (see FIG. 13*f*).

Figure 13G:
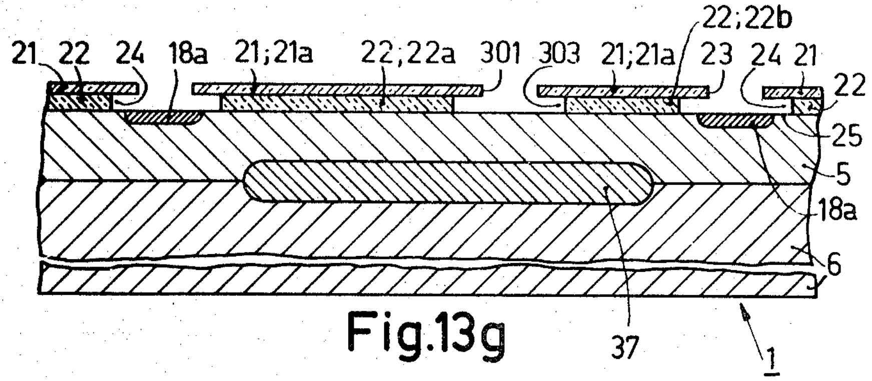

By a selective etching treatment of the intermediate layer 22, the large aperture 24 is then provided in the intermediate layer 22, the further large aperture 303 being formed also in the intermediate layer 22 below the further aperture 301 in the top layer 21, see FIGS. 13*g* and 13*d*.

The sides 301*a* and 301*b* of the further aperture 301 in the top layer 21 are located so near to the edge of the small aperture 23 in the top layer 21 that during the selective etching treatment of the intermediate layer 22 via the apertures 23 and 301, to obtain the large aperture 24 and the further large aperture 303 in the intermediate layer 22, the coherent part of the intermediate layer 22 present below the part 21*a* of the top layer 21 and the aperture 301 is divided into two parts 22*a* and 22*b* separated from each other.

Figure 13H:
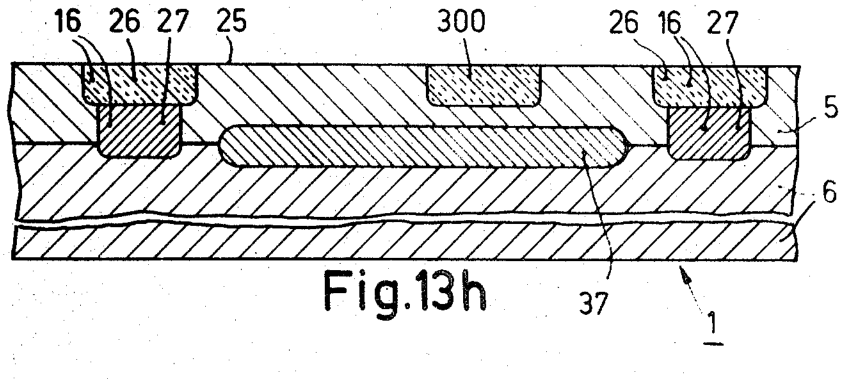

An oxidation treatment is then carried out to obtain the inset silicon oxide layer 26 which forms part of the isolation zones 16, see FIG. 13*h*, and the separation part 300 of silicon oxide which adjoins the oxide layer 26. The impurities in the zone 18*a* are further diffused in the semiconductor body 1 as a result of which the p-type zones 27 are obtained which are present below the oxide layer 26 and are associated with the isolation zones 16. No p-type zone is present below the separation part 300.

By diffusion of impurities, the p-type base zone 3, see FIGS. 13*a* and 13*b*, the n-type emitter zone 2, and the n-type collector contact zone 31 are then provided for which no precision masking methods are necessary.

It is to be noted that the buried layer 37 is not necessary and may be omitted. It is alternatively possible, if the buried layer is present indeed, that the oxide layers 26 and 300 extend throughout the thickness of the epitaxial layer 5, the zone 27 as a channel-interrupting zone being present below the oxide layer 26 in the substrate. It is furthermore possible during the selective etching treatment of the intermediate layer 22 via the small aperture 23 not to mask the aperture 301 and the top layer, as a result of which the intermediate layer 22 below the aperture 301 is also removed during the provision of the small aperture 23*a*, see FIG. 13*e*. During the provision of the p-type zones 18*a* (FIG. 13*f*) a p-type zone is then obtained which is present below the aperture 301, said zone being separated from the zones 18*a*. After providing the oxide layers 26 and 300 (FIG. 13*d*) a p-type zone is also obtained below the oxide layer 300 which zone can penetrate slightly into the buried layer 37 and which is separated from the p-tpe zone 27.

If the aperture 301 (see FIGS. 13*a* and 13*g*), besides with its sides 301*a* and 301*b*, is also provided close to the edge of the part 21*a* of the top layer 21 also with a side 301*c*, the part of the intermediate layer 22 present below the part 21*a* on the right-hand side of the aperture 301 is also entirely removed during the selective etching treatment of the intermediate layer 22 to obtain the large aperture 24 in the intermediate layer 22, and only the part 22*a* of the parts 22*a* and 22*b* of the intermediate layer remains, the further large aperture 303 adjoining the large aperture 24 on three sides. This is shown in FIG. 14*a*.

Before selectively etching the intermediate layer 22 via the apertures 23 and 301, the aperture 301 is also provided in the intermediate layer 22 and via this aperture an n-type impurity is diffused in the semiconductor body to obtain the n-type zone 310. This may be done, for example, by depositing phosphorus-doped silicon oxide on the top layer 21 and in the apertures 23 and 301 and removing said doped oxide layer from the aperture 23 by means of an etching mask consisting of a photolacquer and an etchant. For this purpose no precision photomasking step is necessary. From the doped silicon oxide, phosphorus is then diffused in the semiconductor body via the aperture 301, after which the doped silicon oxide is removed again.

After providing the n-type zone 310, the p-type zone 18*a* is provided by diffusing boron via the small aperture 23 and via the further aperture 301 in the semiconductor body. The boron concentration in the p-type zone 18*a* is lower than the phosphorus concentration in the zone 310 as a result of which no p-type zone is formed in the n-type zone 310.

The oxidation treatment via the large aperture 24 is then carried out and the inset oxide layer 26 (see FIG. 14*b*) is obtained with the underlying p-type zones 27 associated with the isolation zones 16. The oxide layer 26, however, comprises a widening 26*a* below which the n-type zone 310*a* which has been formed by diffusion from the zone 310, is obtained. The n-type zone 310*a* is more highly doped than the n-type epitaxial layer 5 and adjoins the buried n-type layer 37. A short distance may remain between the zones 310*a* and the buried layer 37.

The zone 310*a* constitutes the collector-contact-zone of the transistor to be manufactured, the p-type base zone 3 and the n-type emitter zone 2 of which can be provided in a conventional manner.

Via an aperture 311 in the inset layer in the part 26a of the silicon oxide layer 26, the collector-contact-zone may be contacted. Across the base and emitter zones 3 and 2, a silicon oxide layer which is provided with apertures to contact said zones may be provided in a conventional manner.

The transistor shown in FIG. 14*b* occupies even less space than that shown in FIGS. 13*a* and 13*b*, while nevertheless the places of the isolation zones 16, the base zone 3 and the collector-contact-zone 310*a* are determined by a single mask with which simultaneously the apertures 23 and 301 are provided, which saves a number of precision photomasking steps.

The semiconductor device shown in FIG. 14 in itself is an important new structure and may also be obtained differently. For example, the p-type zones 27 may be obtained in the form of buried layers.

In the examples described so far, the intermediate layer, after varying the electric properties of the small zone, was provided with the large aperture after which the electric properties of the large zone were varied. With reference to FIGS. 15*a* and 15*b*, an embodiment will now be described in which the intermediate layer 22, prior to providing the intermediate layer 22 (see FIG. 15*b*) with the large aperture 322, is first subjected to an interim selective etching treatment, in which the top layer 21 masks against said etching treatment, via the small aperture 23*a* in the top layer.

An aperture 320 which defines a further surface part 324 of the semiconductor body is then formed in the intermediate layer 22.

The surface layer 324 is larger than the small surface part and comprises said small surface part.

The electric properties of a surface zone 321 adjoining said further surface part 324 are then varied via the aperture 320 in the intermediate layer 22.

In the present exmaple, the method to be described according to the invention is used to manufacture the isolation zone 16 with an adjoining channel-interrupting zone 318 as is shown in FIG. 15*a*.

FIG. 15*a* shows a semiconductor device with a transistor similar to that shown in FIG. 8*a* but in which the transistor is provided in an island-shaped part 315 of an epitaxial layer 316 of p-type silicon which is provided on a substrate 317 of n-type silicon.

The oxide layer 77 which is inset in the epitaxial layer 316 over at least part of its thickness forms in this embodiment part of an isolation zone 16 which surrounds the island 315 and which is further constituted by an n-type zone 27 which adjoins the layer 77 and extends to in the n-type substrate 317.

In order to prevent channel formation between the source zone 72 and/or the drain zone 73 of the transistor on the one hand, and the isolation zone 27 on the other hand which is of the same conductivity type as the source zone and the drain zone of the transistor, a channel interrupting p-type zone 318 which is of the same conductivity type as, but has a higher doping than the epitaxial layer 316 and which adjoins the insulation zone 27 and the oxide layer 77 is provided between the insulation zone 27 and the source zone 72 and the drain zone 73.

Such a structure which comprises both an isolation zone 16 and a channel-interrupting zone 318 and which may advantageously be used also in semiconductor devices other than those described here can be manufactured in a very simple manner by using a method according to the invention in which the intermediate layer 22 is subjected several times to an etching treatment. Via the small aperture 23*a* (see FIG. 15*b*) phosphorus is first provided in the epitaxial layer 316 so as to obtain the n-type zone 319. The intermediate layer 22 is then subjected to an interim etching treatment in which the intermedaite layer 22 is removed below the top layer 21 over a distance of approximately 3 μm. Via the resulting aperture 320 which is denoted in broken lines in FIG. 15*b*, boron atoms are then provided in the epitaxial layer 316 as a result of which the p-type zone 321 is obtained. The impurity concentration of the zone 321 is higher than that of the epitaxial layer 316 but lower than that of the zone 319.

The intermediate layer 22 is then again subjected to a selective etching treatment in which the intermedaite layer 22 is again removed over approximately 3 μm. and the last aperture 322 which defines the large surface part 323 of the semiconductor body is obtained in the intermediate layer 22. Via the large aperture 322, the large zone 325 of the epitaxial layer 316 may then be subjected to an oxidation treatment as a result of which the inset oxide layer 77 is obtained. During this oxidation treatment, the impurities provided in the zones 319 and 321 diffuse deeper in the epitaxial layer 316 and constitute there the zones 27 and 318, respectively. In the resulting island 315, the transistor with the source zone 72, the drain zone 73 and the gate electrode 78 may then be provided in a manner as already described with reference to FIGS. 8*a* and *b*.

It will be obvious that the invention is not restricted to the embodiments described and that many variations are possible to those skilled in the art without departing from the scope of this invention. For example, during the selective etching treatment of the intermediate layer to obtain the large aperture, ultrasonic vibrations may be carried out to break those parts of the top layer below which the intermediate layer has already been removed. The conductivity types may be interchanged. The collector contact zone 31 in FIG. 13*b* may extend up to the buried layer 37. The top layer of the masking layer may consist of silicon oxide and the intermediate layer of silicon nitride instead of conversely. Other materials, for example, silicon carbide, polycrystalline silicon, and aluminium oxide, may also be used for the component layers of the masking layer. Furthermore, a masking layer may be used which consists of more than two component layers, which increases the possibilities. Three successive component layers may consist, for example, of silicon oxide, silicon nitride and silicon oxide, respectively. Furthermore, the semiconductor body may consist of a semiconductor material other than silicon, for example, germanium or an AIII–BV compound.

Reference is also made to a related application, Ser. No. 160,650, filed July 8, 1971, which describes and claims various device constructions combining inset oxides with buried doped zones and/or depletion regions for circuit element isolation in monolithic integrated circuits.

What is claimed is:

1. A method of making a semiconductor device comprising the steps of providing on a surface of a semiconductor body a composite masking layer comprising at least two superposed layers of different materials forming an uppermost top layer and an adjoining intermediate layer, forming in at least the top masking layer a relatively small aperture, subjecting the intermediate masking layer to a selective etching treatment with an etchant that attacks it at a substantially greater rate than the top layer until the intermediate layer exposed through the small aperture is removed and underetched to a distance under the top layer which is large compared with the thickness of the intermediate layer to form therein a relatively large aperture under the small aperture, varying the electrical properties of a relatively small zone of the semiconductor body via its surface portion which is defined by the small aperture, varying the electrical properties of a relatively large zone of the semiconductor via its surface portion which is defined by the large aperture, the surface of the large body zone including the surface of the small body zone, and the processing of the body being such that the small body zone or any extension resulting therefrom has a portion extending deeper into the body than the large body zone or any extension resulting therefrom.

2. A method as claimed in claim 1, wherein the step of varying the electrical properties of the small zone is carried out prior to providing the large aperture in the intermediate layer, and, after providing the large aperture in the intermediate layer, the top layer is subjected to a selective etching treatment until it is removed over at least half of its thickness, the parts of the top layer which project above the large aperture in the intermediate layer being also subjected on its lower side to the last-named etching treatment via the large aperture in the intermediate layer and are thus entirely removed.

3. A method as claimed in claim 1, wherein during the selective etching treatment of the intermediate layer to obtain the large aperture, the parts of the top layer below which the intermediate layer is removed are broken by ultrasonic vibrations.

4. A method as claimed in claim 1, wherein during the selective etching treatment of the intermediate layer to obtain the large aperture, a coherent part of the intermediate layer is divided by said selective etching treatment into at least two parts which are separated from each other.

5. A method as claimed in claim 1 wherein a masking layer is used which masks the underlying semiconductor material of the semiconductor body both against doping with an impurity and against oxidation, the electrical properties of the small zone are varied by providing an impurity therein via the small aperture in the small zone, and the electrical properties of the large zone are varied by oxidizing the large zone by means of an oxidation treatment via the large aperture, the impurity provided in the small zone diffusing deeper in the semiconductor body during the oxidation as a result of which a doped zone is obtained locally below the oxide layer obtained during the oxidation treatment and which is inset in the semiconductor body at least over part of its thickness.

6. A method as claimed in claim 5 wherein the oxidation treatment is such that the inset oxide layer, viewed in a direction perpendicular to the surface of the semiconductor body, projects beyond the doped zone at least along a part of the circumference of said zone.

7. A method as claimed in claim 5, wherein after providing the large aperture, an etching treatment is carried out by which a recess is formed at the surface of the semiconductor body at the region of the large aperture in the masking layer, said recess extending less deep in the body than the small zone, the oxidation treatment being then carried out until the recess is at least partly filled with oxide.

8. A method as claimed in claim 5 wherein prior to providing the impurity via the small aperture in the small zone the semiconductor body is subjected to a material-removing treatment via the small aperture as a result of which a recess is formed at the region of said small aperture at the surface of the semiconductor body, said recess being at least partly filled with oxide during the oxidation treatment.

9. A method as claimed in claim 5 wherein a semiconductor body is used which comprises a surface layer of one conductivity type adjoining the said surface and on a substrate of the opposite conductivity type, the surface layer being divided into a number of islands by means of isolation zones, the doped zone adjoining the inset oxide layer being a zone of the opposite-conductivity type, at least a part of the inset oxide layer and the part of the adjoining doped zone being in the form of a pattern surrounding the islands, at least the said part of the oxide layer forming part of the isolation zones.

10. A method as claimed in claim 5 wherein the doped zone adjoining the inset oxide layer is a channel-interrupting zone and being of the same conductivity type as but having a higher doping than the part of the semiconductor body surrounding the zone.

11. A method as claimed in claim 6 wherein the semiconductor body has at least a part adjoining the surface of one conductivity type, the inset oxide layer with the adjoining doped zone are provided in said one type part, the oxide layer, viewed in a direction perpendicular to the surface of the semiconductor body, having an aperture which is surrounded by the doped zone which has a larger aperture the edge of which is present entirely below the inset oxide layer, a surface zone of a semiconductor circuit element being formed in the said part of the semiconductor body at the region of the aperture in the oxide layer, said surface zone at least along a part of its circumference adjoining the oxide layer surrounding said aperture and being separated from the doped zone.

12. A method as claimed in claim 11 wherein in the said part of the semiconductor body at the region of the aperture in the inset oxide layer, two surface zones of the opposite conductivity type which are separated from each other are provided which, at least along a part of their circumference, adjoin the oxide layer surrounding the aperture, and are separated from the doped zone and constitute the source zone and the drain zone of an insulated gate field effect transistor with an intermediate channel region, and a gate electrode is provided above the channel region and is insulated therefrom by an insulating layer the thickness of which is smaller than the thickness of the inset oxide layer, said doped zone being a channel-interrupting zone having the same conductivity type as but a higher doping level than the surrounding portion of the semiconductor body.

13. A method as claimed in claim 11 wherein in the said part of the semiconductor body an inset oxide layer is provided which comprises a number of apertures in which, viewed in a direction perpendicular to the surface, each aperture is surrounded by the doped zone and in which via each of these apertures there is provided in the semiconductor body a surface zone of the opposite conductivity type which and along its circumference adjoins the inset oxide and forms a p-n junction with the underlying semiconductor material, which junction extends substantially parallel to the surface in the semiconductor body and which is separated from the doped zone, said doped zone being a channel-interrupting zone having the same conductivity type as but a higher doping lever than the surrounding portion of the semiconductor body.

14. A method as claimed in claim 6 wherein the small zone and the large zone are present in a region of one conductivity type of the semiconductor body adjoining the surface to be masked and two zones of the opposite conductivity type are provided in said region and constitute the source zone and the drain zone of an insulated gate field effect transistor with an intermediate channel region, the drain zone being constituted as the doped zone obtained below the inset oxide layer, the inset oxide layer overlapping a part of the channel region adjoining the drain zone, an insulating layer being provided on the surface of the channel region present between the source zone and the inset oxide layer, said insulating layer being thinner than the inset oxide layer, the gate electrode of the transistor being provided on said thin layer.

15. The device made by the method according to claim 14.

16. A method as claimed in claim 1 wherein a masking layer is used which masks the underlying semiconductor material of the semiconductor body against doping with impurities, the electrical properties of the small zone are varied by providing impurities via the small aperture within the small zone, and the electrical properties of the large zone are varied by providing impurities via the large aperture within the large zone.

17. A method as claimed in claim 16 wherein the small zone and the large zone are present in a region of one conductivity type of the semiconductor body adjoining the surface to be masked, the small zone extending from the surface deeper in said region than the large zone, the conductivity types of the zones being converted from one conductivity type into the other by doping with impurities, a higher surface concentration of the said impurities being provided in the small zone than in the parts of the large zone surrounding the small zone, whereby there results a p-n-junction having a higher breakdown voltage.

18. A method as claimed in claim 1, wherein the electrical properties of the small zone are varied by means of diffusion of impurities via the small aperture prior to providing the large aperture in the intermediate layer.

19. A method as claimed in claim 1 wherein a masking layer is used having one layer of silicon nitride and another layer of silicon oxide.

20. A method as claimed in claim 1 wherein after the electric properties of the small zone are varied and prior to providing the intermediate layer with a large aperture, the intermediate layer is subjected to an interim selective etching treatment via the small aperture in the top layer as a result of which an interim aperture in the intermediate layer is formed which defines a further surface portion of the semiconductor body which comprises the small surface portion, after which via said interim aperture the electric properties of a further surface zone of the semiconductor body adjoining said further surface portion are varied.

21. A method as claimed in claim 20, wherein the body comprises a surface layer of one type conductivity on a substrate of the opposite type, and wherein an impurity which causes the one conductivity type is provided in the said further surface zone in a concentration which is lower than the concentration of the impurity in the small zone and by an oxidation treatment of the large zone an inset oxide layer is obtained which extends in the surface layer over part of the thickness of the surface layer as a result of which an isolation zone is obtained which is constituted by the oxide layer which is inset at least over part of its thickness in the semiconductor body and by an adjoining doped zone of the opposite conductivity type constituted by said varied small zone, a channel interrupting zone which adjoins the oxide and the doped zone being formed in the said further surface zone and having the same conductivity type as but a higher doping than the surface layer.

22. A method as claimed in claim 1 wherein the etchant used in the selective etching treatment does not substantially attack the semiconductor body.

23. A method of making a semiconductor device comprising the steps of providing on a surface of a semiconductor body containing a region of one conductivity type a composite masking layer comprising at least two superposed layers of different materials forming an uppermost top layer and an adjoining intermediate layer and capable of masking the semiconductor against the introduction of impurities, forming in at least the top masking layer a relatively small aperture, subjecting the intermediate masking layer to a selective etching treatment with an etchant that attacks it at a substantially greater rate than the top layer until the intermediate layer exposed through the small aperture is removed and underetched to a distance under the top layer which is large compared with the thickness of the intermediate layer to form therein a relatively large aperture under the small aperture, introducing one-type-forming impurities via the small aperture into the semiconductor region to form a relatively small one-type zone of the semiconductor body which is more highly doped than the one-type region, and introducing opposite-type-forming impurities in a concentration intermediate that of the one-type impurities in the one-type region and in the small zone via the large aperture into the semiconductor region to form a relatively large opposite-type zone of the semiconductor body which extends deeper into the said region than the small zone, the surface of the large body zone including the surface of the small body zone whereby the large zone surrounds the small zone of one-type conductivity, the device including a bipolar transistor of which the emitter zone is constituted by the small zone, the base zone is constituted by the surrounding large zone, and the collector zone is constituted by the surrounding part of the said body region.

24. A method as claimed in claim 23 wherein simultaneously with the provision of the small aperture in the top layer a further aperture present near said small aperture is provided in the top layer, the surface part of the semiconductor body present below the further aperture being masked against doping by the intermediate layer during the doping of the small zone via the small aperture, the intermediate layer being also subjected via the further aperture in the top layer to the selective etching treatment during the provision of the large aperture in the intermediate layer as a result of which a part of the intermediate layer which defines a further surface part of the semiconductor body and is present below the further aperture is removed, the electrical properties of the large zone and of a zone adjoining the further surface part and adjoining the large zone being then varied by doping with impurities.

References Cited

UNITED STATES PATENTS

| | | | |
|---|---|---|---|
| 3,544,858 | 12/1970 | Kool | 317—235 |
| 3,585,469 | 6/1971 | Jager et al. | 148—1.5 X |
| 3,639,186 | 2/1972 | Forester et al. | 148—187 X |
| 3,645,807 | 2/1972 | Ono et al. | 148—187 |
| 3,681,153 | 8/1972 | Clark et al. | 148—187 |

L. DEWAYNE RUTLEDGE, Primary Examiner

J. M. DAVIS, Assistant Examiner

U.S. Cl. X.R.

29—569; 148—1.5; 156—17; 317—234, 235 E, 235 F, 235 G, 235 AJ